United States Patent
Heino et al.

(10) Patent No.: US 6,598,003 B1
(45) Date of Patent: Jul. 22, 2003

(54) POWER AND ENVIRONMENTAL CONDITION MONITORING SYSTEM AND METHOD

(75) Inventors: Todd V. Heino, Natick, MA (US); Erik J. Kindseth, Manchester, NH (US); Robert T. Thomas, Bedford, NH (US)

(73) Assignee: RX Monitoring Services, LLC, Manchester, NH (US)

( * ) Notice: Subject to any disclaimer, the term of this patent is extended or adjusted under 35 U.S.C. 154(b) by 73 days.

(21) Appl. No.: 09/703,185

(22) Filed: Oct. 31, 2000

(51) Int. Cl.$^7$ .............................................. G06F 19/00
(52) U.S. Cl. ........................... 702/68; 702/68; 702/67; 702/124; 702/130; 340/146.2; 340/501; 340/825.71; 324/600; 324/605; 324/606; 700/9; 700/22; 700/84
(58) Field of Search .................... 702/9, 22, 52, 702/53, 67, 75, 83, 84, 99, 104, 116, 124, 125, 126, 130; 324/600, 605, 606, 607, 629, 630, 76.11, 76.39, 76.47, 76.82, 76.83, 85; 340/146.2, 500, 501, 502, 3.1, 825.73, FOR 103–106; 700/9, 22, 52, 53, 67, 291, 295, 297, 299, 301; 708/100, 131, 132, 300, 311, 316

(56) References Cited

U.S. PATENT DOCUMENTS

| | | | |
|---|---|---|---|
| 3,986,115 A | 10/1976 | Huang | 324/102 |
| 3,986,116 A | 10/1976 | Smith et al. | 324/102 |
| 3,987,393 A | 10/1976 | Knauer | 324/102 |
| 4,187,461 A | 2/1980 | Cox | 324/102 |
| 4,394,540 A | 7/1983 | Willis et al. | 179/2 AM |
| 4,589,074 A | 5/1986 | Thomas et al. | 364/483 |
| 4,697,180 A | 9/1987 | Swanson | 340/870.02 |
| 4,716,364 A | 12/1987 | Guilford et al. | 324/127 |
| 4,724,435 A | 2/1988 | Moses et al. | 340/870.13 |
| 4,728,898 A | 3/1988 | Staley, Jr. | 324/522 |
| 4,757,456 A | 7/1988 | Benghiat | 364/464 |
| 4,782,697 A | 11/1988 | Williams, III | 73/170 A |
| 4,803,632 A | 2/1989 | Frew et al. | 364/464.04 |
| 4,833,618 A | 5/1989 | Verma et al. | 364/483 |
| 4,852,152 A | 7/1989 | Honick | 379/97 |
| 4,856,054 A | 8/1989 | Smith | 379/107 |
| 4,866,761 A | 9/1989 | Thornborough et al. | 379/107 |

(List continued on next page.)

OTHER PUBLICATIONS

Schlindwein et al., Teaching Real–Time DSP Using Digital Signal Processors At the University of Leicester, Jun. 1995, IEEE, 1–8.*

Primary Examiner—Hal Wachsman
Assistant Examiner—Elias Desta
(74) Attorney, Agent, or Firm—Divine, Millimet & Branch, PA; Kevin J. Carroll; Paul C. Remus

(57) ABSTRACT

The power and environmental condition monitoring system monitors the quality of power provided to a site as well as other environmental conditions that might affect the operation of electronic equipment at the site. The system detects and records power events, such as spikes, sags, surges, and other transients, records power conditions, such as voltage level, RMS volts, phase differential, A/C frequency, current, and impedance, and records environmental conditions, such as temperature, vibration, and humidity. The system includes an analog signal receiver that receives analog signals from measurement devices and converts the analog signals into digital signal data. At least some of the channels on the analog boards are high frequency channels capable of receiving and converting high frequency voltage event signals. The system also includes a digital signal processor (DSP) for reading the raw digital signal data from the analog signal receiver and for processing the raw digital signal data. The DSP processes the digital signal data by logging low frequency digital data and by detecting and logging high frequency event digital data. The high frequency event digital data is detected by classifying the data and analyzing the data based upon the class with as few data points as is needed.

30 Claims, 22 Drawing Sheets

U.S. PATENT DOCUMENTS

| | | | |
|---|---|---|---|
| 4,893,332 A | 1/1990 | Brown | 379/97 |
| 4,902,965 A | 2/1990 | Bodrug et al. | 324/116 |
| 4,940,947 A | 7/1990 | McCartney et al. | 324/613 |
| 5,010,568 A | 4/1991 | Merriam et al. | 379/107 |
| 5,025,470 A | 6/1991 | Thornborough et al. | 379/107 |
| 5,027,285 A | 6/1991 | McCartney et al. | 364/483 |
| 5,053,766 A | 10/1991 | Ruiz-del-Portal et al. | 340/870.02 |
| 5,079,715 A | 1/1992 | Venkataraman et al. | 364/481 |
| 5,140,492 A | 8/1992 | Schweitzer, III | 361/80 |
| 5,153,837 A | 10/1992 | Shaffer et al. | 364/464.04 |
| 5,189,694 A | 2/1993 | Garland | 379/106 |
| 5,270,637 A | 12/1993 | McEachern et al. | 324/102 |
| 5,285,167 A | 2/1994 | Carangelo | 330/10 |
| 5,434,911 A | 7/1995 | Gray et al. | 379/106 |
| 5,454,031 A | 9/1995 | Gray et al. | 379/106 |
| 5,469,365 A | 11/1995 | Diekema et al. | 364/483 |
| 5,513,112 A | 4/1996 | Herring et al. | 364/464.02 |
| 5,528,507 A | 6/1996 | McNamara et al. | 364/483 |
| 5,528,675 A | 6/1996 | Chen | 379/106 |
| 5,548,633 A | 8/1996 | Kujawa et al. | 379/93 |
| 5,559,870 A | 9/1996 | Patton et al. | 379/107 |
| 5,590,179 A | 12/1996 | Shincovich et al. | 379/107 |
| 5,594,706 A | 1/1997 | Shenoy et al. | 367/76 |
| 5,602,744 A | 2/1997 | Meek et al. | 364/464.22 |
| 5,627,759 A | 5/1997 | Bearden et al. | 364/483 |
| 5,631,636 A | 5/1997 | Bane | 340/825.69 |
| 5,638,296 A | 6/1997 | Johnson et al. | 364/492 |
| 5,696,695 A * | 12/1997 | Ehlers et al. | 364/492 |
| 5,899,960 A * | 5/1999 | Moore et al. | 702/60 |

* cited by examiner

Summary Report

Customer Information

Site Information

Report To:

Voice:
Fax:

CC:

Site #:
Type:
Recorder S/N:
Site Equipment:
Monitor Location:
Client Site Code:

| Power Quality | Chan L1-L2 | Chan L1-L3 | Chan L2-L3 | Chan N-G | Rx Rating | Meets Specs | Comments |
|---|---|---|---|---|---|---|---|
| Power Failures | 0 | 0 | 0 | 0 | Good | Yes | |
| Sags | 7 | 3 | 10 | 0 | Minor | No | UPS required: See event log for details |
| Surges | 0 | 0 | 0 | 0 | Good | Yes | Good |
| Impulses | 1103 | 1131 | 1009 | 251 | N/A | N/A | Protection required to prevent damage |
| HF Sens. Low | 10 | 10 | 10 | 20 | N/A | N/A | |
| HF Sens. High | 25 | 20 | 20 | 30 | N/A | N/A | |

| Data Logging | Actual Low | Actual High | Low Spec | High Spec | Rx Rating | Meets Specs | Comments |
|---|---|---|---|---|---|---|---|
| Chan L1-L2 | 196 | 208 | 198 | 228 | Minor | No | Low voltage |
| Chan L1-L3 | 198 | 208 | 198 | 228 | Good | Yes | Within spec. but on low side |
| Chan L2-L3 | 195 | 206 | 198 | 228 | Minor | No | Power protection required |
| Chan N-G | 0 | 1.4 | 0 | 2 | Good | Yes | Due to current flowing on Ground |
| Temperature | | | | | | | Not connected |
| Humidity | | | | | | | Not connected |
| Frequency | 59.9 | 60.1 | 59 | 61 | Good | Yes | Within Spec. |
| L1 Current | | | | | | | |
| L2 Current | | | | | | | |
| L3 Current | | | | | | | |
| N Current | | | | | | | |
| G Current | | | | | | | |

Rx Ratings

| Safety | Severe | Moderate | Minor | Good |
|---|---|---|---|---|
| NEC Violation or other Safety Hazard | Damage is likely | Damage is possible Disruption is likely | Damage unlikely Disruption is possible | Meets Manufacturer Specifications |

Detail Event Log

Site:

| Date / Time | Event ID | Event Type | Chan | P1 | P2 | P3 |
|---|---|---|---|---|---|---|
| Jan 21 00 14:49:20 | 30 | System Power-Up | | | | |
| Jan 21 00 15:49:23 | 31 | Start | | | | |
| Jan 21 00 15:49:23.11 | 32 | HF Transient | L1-L2 | -25 | 0 | 0 |
| Jan 21 00 15:49:23.11 | 33 | HF Transient | L1-L3 | 41 | 8 | 0 |
| Jan 21 00 15:49:23.14 | 34 | HF Transient | L1-L2 | 10 | 0 | 0 |
| Jan 21 00 15:49:23.26 | 35 | HF Transient | L1-L2 | -25 | 0 | 184 |
| Jan 21 00 15:49:24.20 | 36 | HF Transient | L1-L2 | 25 | 0 | 5 |
| Jan 21 00 15:49:25.36 | 37 | HF Transient | L1-L2 | 20 | 0 | 7 |
| Jan 21 00 15:49:25 | 38 | HF Volt Sensitivity | L1-L2 | 15 | | |
| Jan 21 00 15:49:26.39 | 39 | HF Transient | L1-L3 | 41 | 257 | 10 |
| Jan 21 00 15:49:26.42 | 40 | HF Transient | L1-L3 | 36 | 8 | 7 |
| Jan 21 00 15:49:28 | 41 | RMS Nominal | L1-L2 | 208 | | |
| Jan 21 00 15:49:28 | 42 | RMS Nominal | L1-L3 | 208 | | |
| Jan 21 00 15:49:28 | 45 | RMS Nominal | L2-L3 | 208 | | |
| Jan 21 00 15:49:28 | 50 | RMS Nominal | N-G | 1 | | |
| Jan 21 00 15:49:28.07 | 51 | HF Transient | L2-L3 | 20 | 0 | 7 |
| Jan 21 00 15:49:28.32 | 52 | HF Transient | L1-L3 | 36 | 9 | 7 |
| Jan 21 00 15:49:29.14 | 53 | HF Transient | L2-L3 | -25 | 0 | 182 |
| Jan 21 00 15:49:30.41 | 54 | HF Transient | L1-L3 | 41 | 12 | 7 |
| Jan 21 00 15:49:30 | 55 | HF Volt Sensitivity | L1-L3 | 15 | | |
| Jan 21 00 15:49:32.96 | 56 | HF Transient | L2-L3 | -30 | 0 | 182 |
| Jan 21 00 15:49:33.60 | 57 | HF Transient | L2-L3 | 15 | 0 | 298 |
| Jan 21 00 15:49:39.81 | 58 | HF Transient | L2-L3 | -30 | 0 | 184 |
| Jan 21 00 15:49:39 | 59 | HF Volt Sensitivity | L2-L3 | 15 | | |
| Jan 21 00 15:53:13.56 | 60 | HF Transient | N-G | 7 | 21 | 0 |
| Jan 21 00 16:02:33.74 | 64 | HF Transient | N-G | 7 | 38 | 0 |
| Jan 21 00 16:49:25 | 66 | HF Volt Sensitivity | L1-L2 | 10 | | |
| Jan 21 00 16:49:25.67 | 67 | HF Transient | L1-L2 | -25 | 0 | 119 |
| Jan 21 00 16:49:25.90 | 68 | HF Transient | L1-L2 | 20 | 0 | 7 |
| Jan 21 00 16:49:26.97 | 69 | HF Transient | L1-L2 | -15 | 0 | 119 |
| Jan 21 00 16:49:27.40 | 70 | HF Transient | L1-L2 | -25 | 0 | 118 |
| Jan 21 00 16:49:27.48 | 71 | HF Transient | L1-L2 | 10 | 0 | 300 |
| Jan 21 00 16:49:27 | 72 | HF Volt Sensitivity | L1-L2 | 15 | | |
| Jan 21 00 16:49:30 | 73 | HF Volt Sensitivity | L1-L3 | 10 | | |
| Jan 21 00 16:49:34.73 | 74 | HF Transient | L1-L3 | -10 | 0 | 182 |
| Jan 21 00 16:49:36.62 | 75 | HF Transient | L1-L3 | 36 | 9 | 4 |
| Jan 21 00 16:49:39 | 76 | HF Volt Sensitivity | L2-L3 | 10 | | |
| Jan 21 00 16:49:42.99 | 77 | HF Transient | L1-L3 | 36 | 10 | 10 |
| Jan 21 00 16:49:44.45 | 78 | HF Transient | L1-L3 | -15 | 0 | 187 |

Parameters

| RMS Nominal | RMS Re-Nominal | HF Transient | HF Sensitivity | RMS Sag/Surge |
|---|---|---|---|---|
| P1 = Nominal Volts | P1 = Prev Nom Volts | P1 = Peak Voltage | P1 = Sens Val | P1 = Peak Voltage |
| | P2 = New Nom Volts | P2 = Duration uSec | | P2 = Duration mSec |
| | | P3 = Phase Angle | | P3 = Nom Voltage |

Comments:

Impulses & Sags indicate a need for protection from hardware failure and system resets. A low impedance power conditioner or UPS is required to prevent future system resets and hardware damage. See manufacturer for recommended models.

POWER AND ENVIRONMENTAL CONDITION MONITORING SYSTEM AND METHOD

FIELD OF THE INVENTION

The present invention relates to analog signal monitoring systems and methods and in particular, to a power and environmental condition monitoring system and method that monitors power and environmental conditions at a remote site.

BACKGROUND OF THE INVENTION

As a result of the widespread use of computers and other microprocessor-based equipment, the quality of power and other environmental conditions at sites having such equipment has become increasingly important. Utility companies deliver electric power to customer sites as an alternating current (AC) voltage through an secondary power distribution system. Various distribution system and environmental factors, however, can cause power line transients, such as spikes, surges, or sags, and can cause blackouts, brownouts, or other distribution system problems that greatly affect the quality of power received by the customer at a site. Electronic equipment, such as computers and other equipment with microprocessors, are susceptible to damage and/or a faulty operation as a result of power line transients and other poor power quality conditions. The quality of power is likely to become increasingly important as the utility industry is deregulated and the utility companies compete more aggressively for power users.

One attempt at improving the quality of power at a site has been to install a power conditioner. This solution, however, often provides a false sense of security. Power protection manufacturers typically design power conditioner systems assuming that a site meets the National Electrical Code for safety. Power protection manufacturers also assume that a site has good, solid earth ground and only one grounding path. With substandard grounding, many power conditioners will not provide optimum protection and the resulting impulse let through and high frequency noise will adversely affect system performance. Thus, power conditioners may suffer from the same problems caused by poor power quality. Also some power conditioners do not address all potential power quality problems, such as voltage regulation issues or outages. The typical power conditioner is designed to filter high frequency events only leaving the system vulnerable to low frequency events, such as power factor correction and harmonics. Power conditioning also fails to address numerous other issues that can affect the equipment reliability and performance, such as temperature, humidity, air quality, vibration and numerous other environmental conditions.

Another solution is to use power monitoring equipment to monitor the power quality at a site either before installing electronic equipment or after problems occur with the electronic equipment. Conventional power monitoring equipment suffers from numerous drawbacks. Existing power monitoring equipment is overly complex, expensive, and typically requires a special setup, depending upon the site. In addition to not being user-friendly, the existing systems are not capable of organizing the data and presenting the data in a useful format. Although existing systems are capable of gathering large amounts of data, these systems are unable to adequately process, save and transmit that data for use in generating power quality reports that facilitate correcting the problems. In these systems, the vast amount of data must often be recorded and sent out for processing, and a report is mailed at a much later time.

In addition to systems that generate too much data, some existing systems generate too little data such that a determination cannot be made as to why certain power events might have occurred. Existing power monitoring equipment also does not have the capability of monitoring multiple channels including extensive monitoring of environmental conditions as well as power conditions and power events. Traditional power monitors are also not set up to do interactive tests (e.g., input and output of a UPS or power conditioner, data gathering of the UPS status log, or a line impedance test for measuring the line resistance). the ability to provide a more comprehensive data gathering for all of the site's conditions has traditionally been lacking.

Accordingly, a system and method is needed for monitoring power and environmental conditions that is easier to set up and operate. A power and environmental condition monitoring system and method is also needed that improves the processing, storage and transfer of data using data compression techniques. A power and environmental condition monitoring system and method is also needed that is capable of presenting analyzed data in a format that allows a customer to understand the problem and to attempt to correct that problem. A power and environmental condition monitoring system and method is also needed that monitors multiple channels in real time, including environmental condition signals, and that has the ability to run interactive tests and gather data from remote devices (i.e., UPS system logs).

SUMMARY OF THE INVENTION

The present invention features a power and environmental condition monitoring system, for monitoring power and environmental conditions at a site. The system comprises at least one analog signal receiver including a plurality of analog signal channels for receiving a plurality of analog measurement signals representing power and environmental conditions, for converting the analog measurement signals into digital signals including digital signal data, and for buffering the digital signal data. The analog signal channels include at least one high/low frequency voltage channel for monitoring voltage signals including high frequency voltage events and at least one configurable multi-purpose channel for monitoring low frequency analog measurement signals. At least one digital signal processor, connected to the analog receiver, reads the digital signal data buffered by the analog signal receiver and processed the digital signal data. The digital signal processor processes the digital signal data by logging at least some of the digital signal data, and wherein digital signal processor processes the digital signal data by analyzing at least some of the digital signal data to detect a pattern consistent with an event and by logging selected values of the digital signal data sufficient to define said event. A post-processing system, connected to the digital signal processor, stores and post processes processed digital signal data received from the digital signal processor.

The post-processing system preferably includes a communications device for communicating with a remote location and for transmitting said processed digital signal data to the remote location. In one embodiment, the post-processing system is implemented on a personal computer. In this embodiment, the analog signal receiver includes at least one analog board connected to the personal computer, and the digital signal processor includes at least one digital signal processor board connected to the personal computer. The multi-purpose channel is preferably configurable to monitor one of a low frequency voltage signal, a current signal, and an environmental condition signal and the personal computer preferably includes software for configuring the multi-purpose channel.

The digital signal processor preferably includes a sample digital signal processor, connected to the analog signal receiver, and a process digital signal processor, connected to the sample digital signal processor. The sample digital signal processor reads the digital signal data buffered by the analog signal receiver and addresses and buffers the digital signal data. The process digital signal processor receives the digital signal data transmitted by the sample digital signal processor and processes the digital signal data. The sample digital signal processor reads digital signal data buffered by the analog signal receiver using an interrupt, and polls the digital signal data buffered by the analog signal receiver to read the digital signal data representing the high frequency events.

The present invention also features a method of monitoring power and environmental conditions. The method comprises: receiving analog voltage signals over high/low frequency voltage inputs and receiving analog measurement signals over multi-purpose inputs; converting the analog voltage signals and the analog measurement signals into low frequency digital data; monitoring the analog voltage signals to detect high frequency voltage signals representing high frequency voltage events; converting the high frequency voltage signals into high frequency digital data; processing the low frequency digital data by logging selected values of the low frequency digital data into at least one data log file; and processing the low frequency digital data and the high frequency digital data by detecting events and logging the events in an event log file.

The present invention also features an analog signal receiver for use in a power and environmental condition monitoring system. The analog signal receiver comprises a plurality of analog signal inputs including high/low voltage signal inputs for receiving voltage signals and multi-purpose inputs for receiving low frequency analog measurement signals. A plurality of isolated measurement circuits measure the voltage signals received on said high/low voltage signal inputs. Analog signal processing circuitry processes the voltage signals and the low frequency analog measurement signals. A multiplexer multiplexes the voltage signals and the analog measurement signals into a multiplexed low frequency analog signal. A low frequency A/D converter converts the multiplexed low frequency analog signal to low frequency digital signal data. A low frequency buffer buffers the low frequency digital signal data.

The analog signal receiver further includes a high frequency voltage event detector for detecting high frequency voltage events. At least one high frequency A/D converter converts the high frequency voltage events to high frequency voltage digital data. A high frequency buffer buffers the high frequency voltage digital data.

Each isolated measurement circuit preferably includes an isolation amplifiers and an isolated signal transmitter connected to the isolation amplifier. The isolated signal transmitter can include a linear optocoupler, a transformer coupler, and a capacitive coupler. The high frequency voltage event detector preferably includes a peak detect circuit.

The present invention also features a system and method for processing data in a power and environmental condition monitoring system. The method comprises receiving high frequency data and low frequency data, representing voltage signals and condition signals. The method also comprises generating data log entries each including at least a date/time stamp and at least some of the low frequency data and logging the data log entry in a data log. The method further comprises classifying the high frequency and low frequency data to determine an event classification; analyzing the high frequency and low frequency data based upon the event classification and selecting sufficient data values to define the event; generating an event data log entry; and logging the event data log entry into an event log.

DESCRIPTION OF THE DRAWING

These and other features and advantages of the present invention will be better understood by reading the following detailed description, taken together with the drawings wherein:

FIGS. 17–26 illustrate reports and graphs created by the system, according to one embodiment of the present invention.

DETAILED DESCRIPTION OF THE PREFERRED EMBODIMENT

Figure 1:
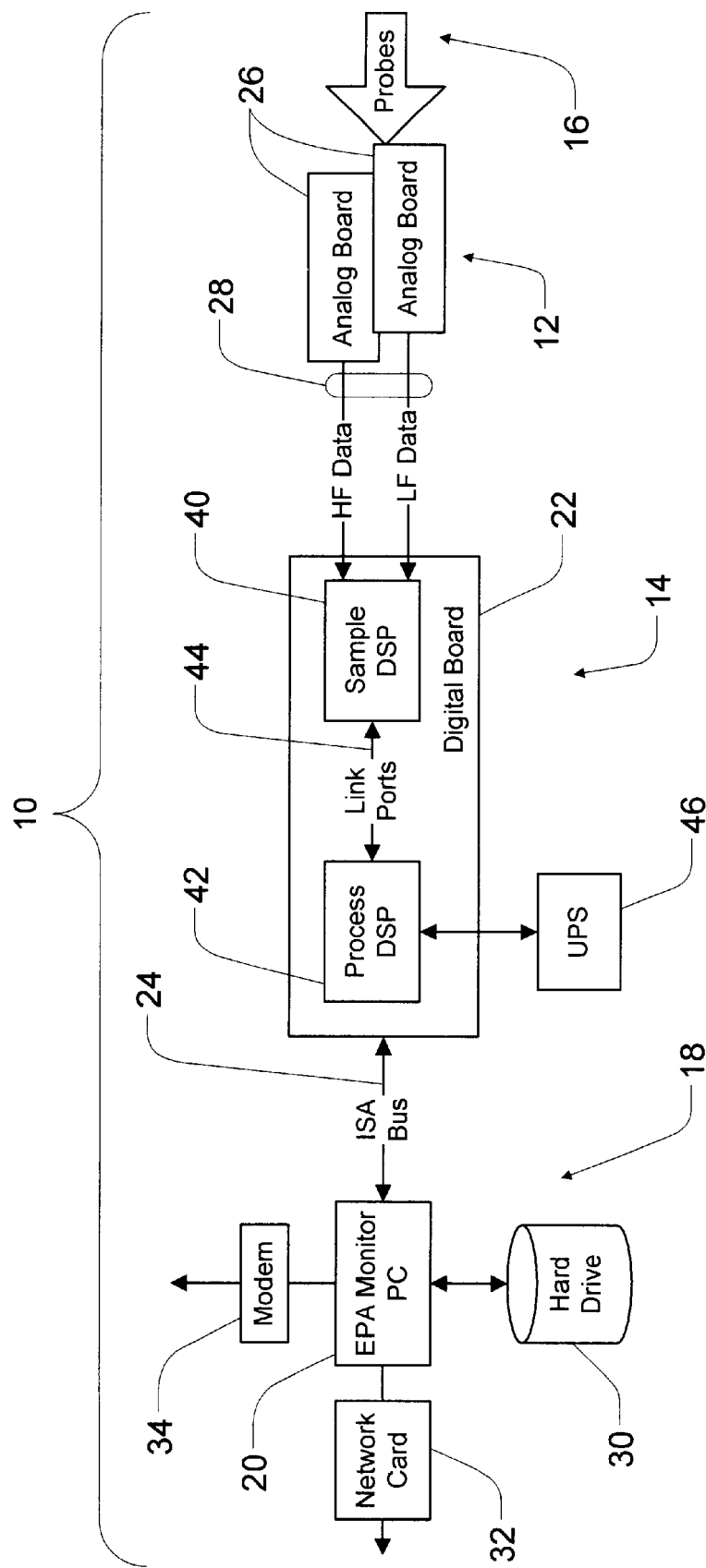
FIG. 1 is a schematic diagram of the power and environmental condition monitoring system, according to the present invention.

The power and environmental condition monitoring system 10, FIG. 1, according to the present invention, is used to monitor the quality of power provided to a site as well as other environmental conditions that might affect the operation of electronic equipment at the site. The system 10 detects and records power events, such as spikes, sags, surges, and other transients, records power conditions, such as voltage level, RMS volts, phase differential, A/C frequency, current, line impedance and ground potential, and records environmental conditions, such as temperature, DC volts, shock, vibration, and humidity. The system 10 can be used to monitor any type of event or condition capable of being detected or measured.

The power and environmental condition monitoring system 10 is, first described in general and then the exemplary embodiment of each component of the system 10 is described in greater detail. In general, the system 10 includes an analog signal receiver 12, a digital signal processor (DSP) 14, measurement devices 16, and a post-processing system 18.

The analog signal receiver 12 includes a plurality of analog signal channels for receiving analog measurement signals from the measurement devices 16, such as test leads, passive probes and active probes. One or more of the analog signal channels on the analog signal receiver 12 are capable of monitoring high frequency voltage signals representing high frequency power events, such as high frequency voltage events and high frequency ground events. In one example, the analog signal receiver 12 includes 48 channels with 10 channels capable of monitoring high frequency voltage signals. The analog signal receiver 12 converts the analog measurement signals into digital signals and buffers the digital signals.

The DSP 14 reads the digital signal data buffered by the analog signal receiver 12 and processes the digital signal data by logging at least some of the digital signal data and by analyzing the digital signal data to detect power events. The DSP 14 buffers the processed data (i.e., the logged data values and the data representing detected events) and transmits the processed data to the post-processing system 18.

The post-processing system 18 stores the processed data and performs post-processing, such as formatting the processed data and generating reports. The post-processing system 18 can also communicate with a remote client for performing various tasks remotely, such as downloading data, remotely controlling the system 10, and performing diagnostic functions.

According to the exemplary embodiment, the post-processing system 18 includes a PC 20, a storage device 30, such as a hard drive or memory, and one or more communications devices, such as a network card 32 and/or a modem 34. The exemplary DSP 14 is implemented as a digital board 22 added on to the PC 20 and connected by way of a bus 24, such as an ISA bus or a PCI bus. The exemplary DSP 14 preferably includes a sample DSP (SDSP) 40 and a process DSP (PDSP) 42 on the same digital board 22 and connected by communication ports 44. The SDSP 40 and PDSP 42 are each dedicated to different tasks to improve processing. The PDSP 42 can also communicate with an internal uninterruptible power supply (UPS) 46 to detect power outages and to notify the PC 20 accordingly to shut down the system 10. The exemplary analog signal receiver 12 is implemented as one or more analog boards 26 added on to the PC 20 and connected to the digital board 22 by way of a bus 28. Software running on the PC 20 can be used to configure and test the analog board(s) 26 and the digital board 22. Although these exemplary embodiments of the analog signal receiver 12, DSP 14, and post-processing system 18 are shown and described herein, other configurations and implementations of the system 10 are contemplated and are within the scope of the present invention.

Figure 2:
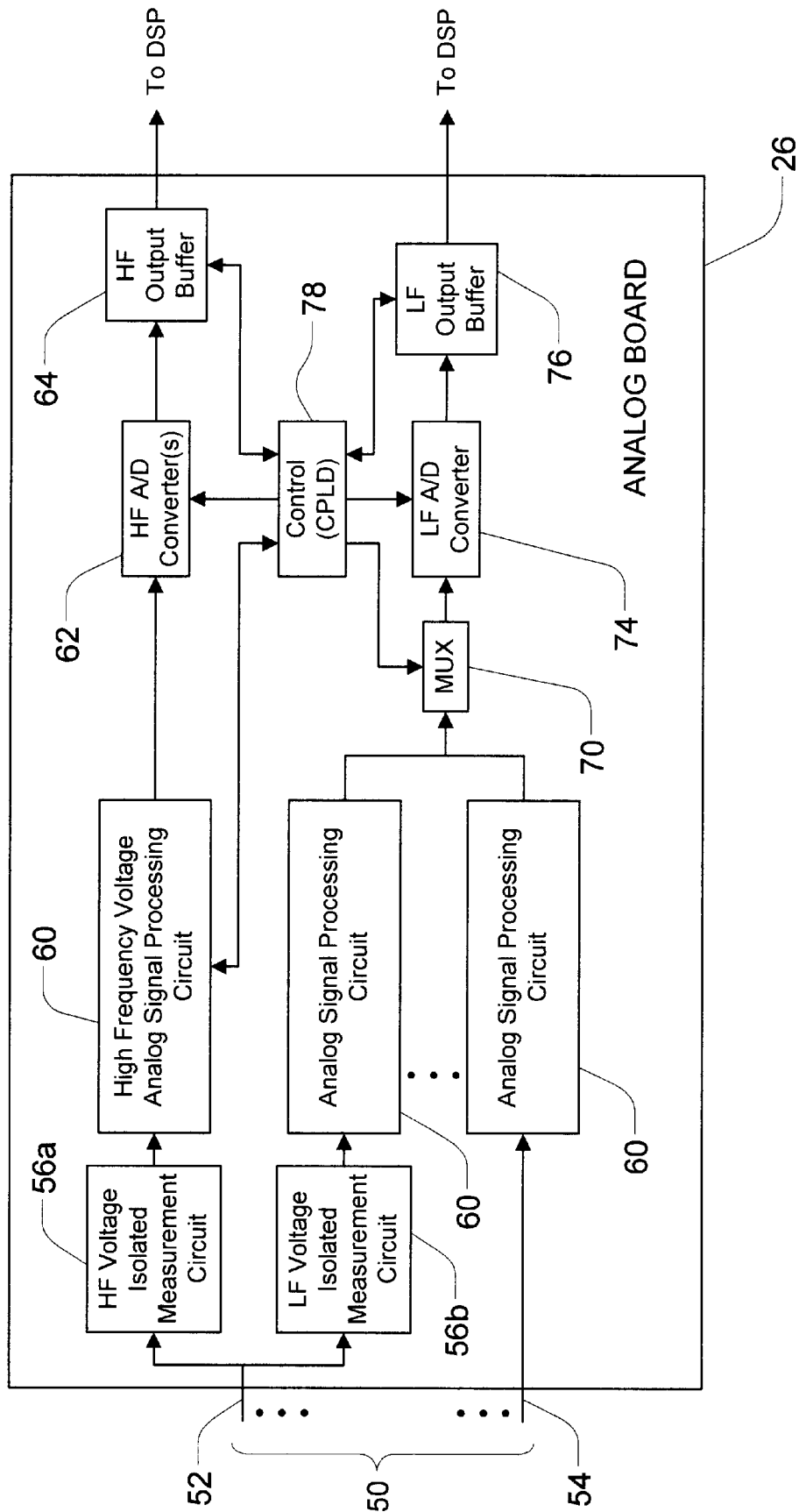
FIG. 2 is a schematic block diagram of an analog board used in the system, according to the present invention.

According to the exemplary embodiment, each analog board 26, FIG. 2, includes a plurality of analog signal inputs 50 for connecting the measurement devices 16 to the analog signal channels. The inputs 50 include voltage inputs 52 connected to high/low frequency voltage channels capable of detecting high frequency voltage transients as well as low frequency events. In one example, the voltage inputs 52 include voltage inputs for each of three phases (L1, L2, L3), for ground (G), and for neutral (N).

The inputs 50 also include multi-purpose inputs 54 connected to multi-purpose channels used for low frequency monitoring such as current, temperature, vibration, humidity, and the like. Multi-purpose channels can also be used for low frequency voltage monitoring, such as DC Volts and ground monitoring. In one example, the multi-purpose inputs 54 include current inputs for each of three phases (L1, L2, L3), for ground (G), and for neutral (N), a DC voltage input, a temperature input, a humidity input, and a vibration input. As described in greater detail below, each of the multi-purpose inputs and channels can be configured for any type of low frequency monitoring.

High/low frequency voltage inputs 52 are preferably connected to two isolated measurement circuits 56a, 56b for taking a high frequency voltage measurement and a low frequency voltage measurement. In one example, the voltage measurement circuit 56a for the high frequency voltage measurement provides a 4,000:1 reduction and the voltage measurement circuit 56b for the low frequency voltage measurement provides a 400:1 reduction.

The preferred embodiment of the isolated measurement circuits 56a, 56b is a multi-channel differential isolated measurement circuit including an isolation amplifier and an isolated signal transmitter connected to the isolation amplifier. According to one embodiment, the isolated signal transmitter includes a linear opto-coupler. By using an optically coupled isolation amplifier high accuracy, linearity, and temperature stability are achieved. This circuit acts as a current-to-voltage converter. By providing isolation between two different potentials, the differential isolated measurement circuit prevents false data commonly found in differential amplifiers, which are the foundation of many circuits.

According to another embodiment, the isolated signal transmitter includes a transformer coupler for magnetically coupling the isolation amplifier to the voltage signal conditioner. According to a further embodiment, the isolated signal transmitter includes a capacitive coupler, such as four (4) and six (6) plate capacitors, for capacitively coupling the isolation amplifier to the voltage signal conditioner.

The analog board 26 further includes analog signal processing circuitry 60 coupled to the isolated measurement circuits 56a, 56b and to the multi-channel inputs 54. In the exemplary embodiment, the analog signal processing circuitry 60 includes overvoltage protection, voltage signal conditioners, sample and hold circuits, and input buffers. A multiplexer 70 connected to the analog signal processing circuitry 60 multiplexes the analog signals on all of the channels and passes the multiplexed analog signals to an A/D converter 74. The A/D converter 74 converts the analog signals on each of the channels to digital signal data.

A buffer 76, such as a FIFO buffer, is coupled to each of the A/D converters 74, for continuously buffering the digital data corresponding to the voltage signals and condition monitoring signals. A control 78 controls the timing and state of the A/D converter 74, FIFO buffer 76 and multiplexer 70. In one example, the control 78 is a hardware function implemented as a complex programmable logic device (CPLD) field programmable gate array (FPGA).

The analog board 26 preferably includes a high frequency A/D converter 62 for each of the high frequency voltage channels to convert high frequency voltage signals to digital data. The high frequency voltage digital data is sent to a buffer 64, such as a first-in/first-out (FIFO) buffer or memory. The analog board 26 further includes a high frequency voltage event detector for detecting high frequency voltage events, such as transients. The high frequency FIFO buffer 64 writes the data on and takes the data off until a high frequency event is detected. The FIFO buffer or memory preferably has a capacity capable of buffering the digital data values corresponding to the high frequency event as well as a configurable number of digital data values just prior to the event. For example, the FIFO buffer 64 is preferably 512 data values deep and can be configured up to 32,000 data values deep.

According to one embodiment, the high frequency detector is an adjustable peak detect circuit within the high frequency analog signal processing circuitry 60 for detecting high frequency events. When a high frequency event occurs on a channel, the peak detect circuit indicates to the control 78 that an event has occurred. The control 78 controls the FIFO buffer 64 to stop taking digital data off. Each peak detect circuit distinguishes between a positive or a negative going event. One example of the peak detect circuit includes two independent precision voltage controlled comparators. The peak detect circuit can be incremented or stepped by 256 values providing precision to discriminate or filter out unwanted voltage signals such as background noise. The peak detect circuit can also be configured to provide different triggering frequencies.

The analog board 26 can also include separate RMS voltage and current circuitry that provides RMS data without using the DSP. This RMS circuitry allows fast calculation (e.g., waveshape, harmonics, etc.) to be performed while conserving the processing power of the DSP.

Figure 3:
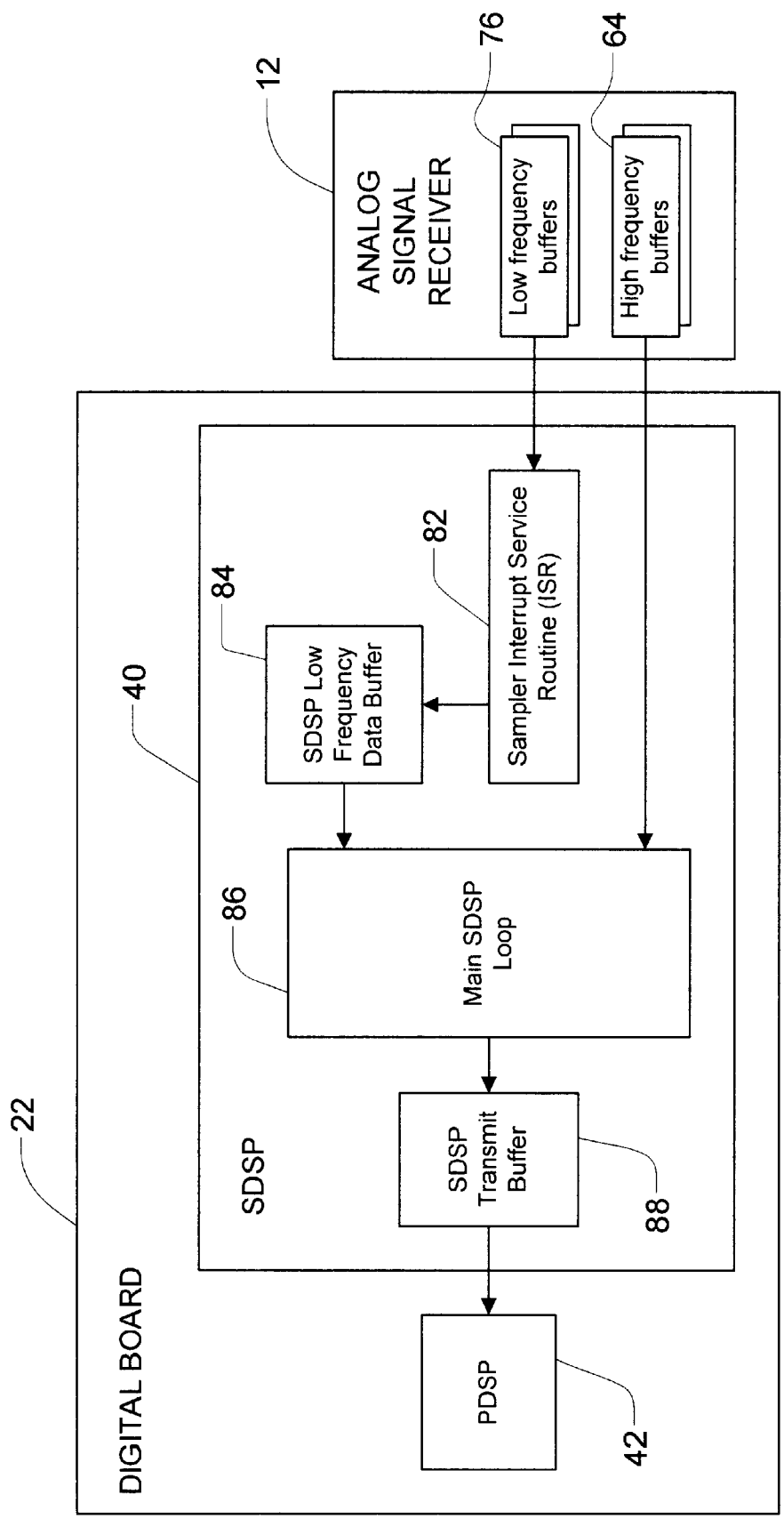
FIG. 3 is a schematic functional block diagram of the sample digital signal processor used in the system, according to the present invention.

According to the exemplary embodiment, the SDSP 40, FIG. 3, receives the high frequency digital data from the high frequency buffers 64 and the low frequency digital data from the low frequency buffers 76 on the analog signal receiver 12. The SDSP 40 polls the high frequency buffers 64 for high frequency events and reads the digital data buffered for each event detected. The high frequency voltage channels are used to detect very high frequency events that would not be detected at the bandwidth at which the low frequency voltage channel is sampling. These channels sample in a burst mode at a very high frequency, but for a shorter duration, since the high frequency data cannot be processed in real time.

A sample interrupt service routine (ISR) 82 reads digital data buffered in the low frequency buffers 76 and buffers the low frequency data in a SDSP low frequency data buffer 84. The digital data read by the SDSP 40 from the high and low frequency buffers is raw data. A main SDSP loop 86 addresses the high frequency raw data and the low frequency raw data and sends the data to SDSP transmit buffer 88. When the SDSP transmit buffer 88 is full, the data is transmitted to the PDSP 42.

The large amount of raw data that is gathered by the SDSP 40 would be cumbersome to maintain and download. The SDSP 40 transmits the raw data to the PDSP 42 for processing before being stored or transmitted. Processing includes logging data representing conditions being monitored, such as A/C frequency, phase differential, temperature, humidity, and the like. Processing also includes detecting events, such as sags, surges, high frequency events, and the like, and logging the events by storing data defining the detected event.

Figure 4:
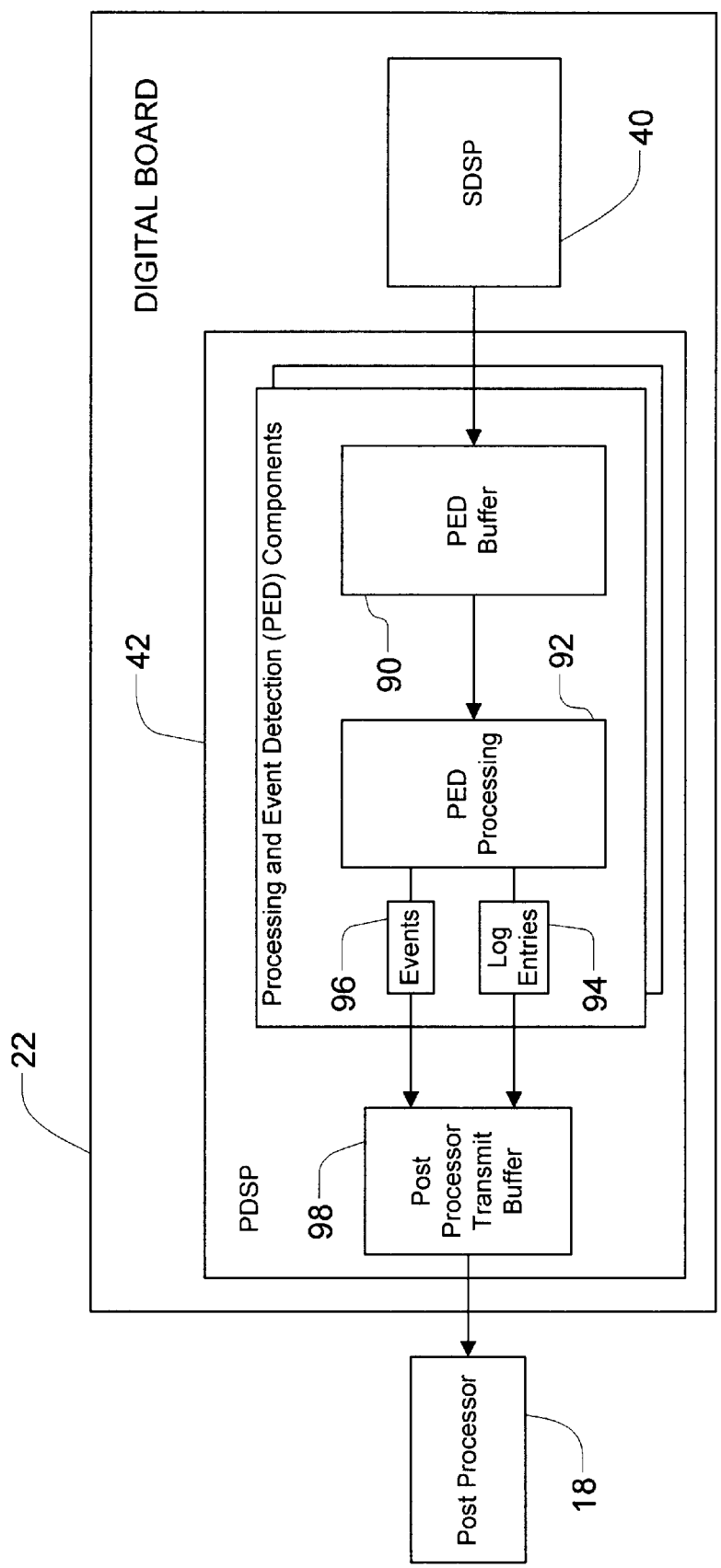
FIG. 4 is a schematic functional block diagram of the process digital signal processor used in the system, according to the present invention.

According to the exemplary embodiment, the PDSP 42, FIG. 4, includes a processing and event detection (PED) buffer 90 for buffering the raw data received from the SDSP 40 and a PED processing component 92 for processing the raw data and storing the processed data. Data log files 94 are used for the low bandwidth inputs or less frequent data calculations and event log files 96 are used for the high bandwidth inputs.

The PED processing component 92 is preferably implemented as software. For data logging, PED processing component 92 receives the raw data from the PED buffer 90 and appends a log entry to the end of a data log file 94. Each log entry includes at least a date/time stamp and the data values needed to define the condition being logged. The log entry can also include other data such as phase angle, duration, channel number, and/or A/C frequency. The system preferably includes a data log file 94 for each of the channels being monitored. Examples of the low frequency data include low frequency ground monitoring, RMS volts, phase differential, A/C frequency, current, temperature, vibration, and humidity, as will be described in greater detail below.

For event detection and logging, the PED processing component 92 receives the raw data from the PED buffer 90 and uses an algorithm to classify the data based upon predefined rules in a knowledge base. The PED processing component 92 also analyzes the event data to determine how the event data values should be stored. If the event is a high frequency event, for example, the PED processing component 92 selects the minimum number of data values needed to define the event based upon the classification of the event. For each detected event, an event entry is added to the event log file 96. Each event entry includes at least a date/time stamp, the event classification, and the selected minimum number of data values (i.e., the compressed event data). The high frequency event data is thereby compressed and can be stored and transmitted more easily. Examples of the events processed by the PED processing component 92 include A/C wave-shape events, voltage events, and ground events, as described in greater detail below. Also, whenever a system events occurs, such as a start, stop, power-up, power-down, an event entry can be generated and appended to the event log 96.

The PDSP 42 buffers and transmits the processed data to the PC 20 for post-processing, storage or transmission. The PDSP 42 transmits the processed data in the data log files 94 and the event log file(s) 96 to the PC 20. The PC 20 stores the processed data and can generate a data report using the processed data or can transmit the processed data to a remote location for generation of the report. The raw data for any of the channels can also be stored, if needed.

According to one embodiment, the PC 20 formats the data in a standard form so that the files can be easily accessed and shared across a network, for example, by downloading via the modem 34 or network card 32 (e.g., using a TCP/IP connection). The PC 20 can process the data by removing any start-up or initial test data and by reviewing the data for patterns or irregularities. The data can then be reformatted and archived into a central computer. The data can also be used to generate a specific report for a site being monitored and then archived for use as a monthly, quarterly, or yearly summary report for that site. The individual site data can also be compared to other similar sites and compiled into a status report with site comparisons.

Figure 5:
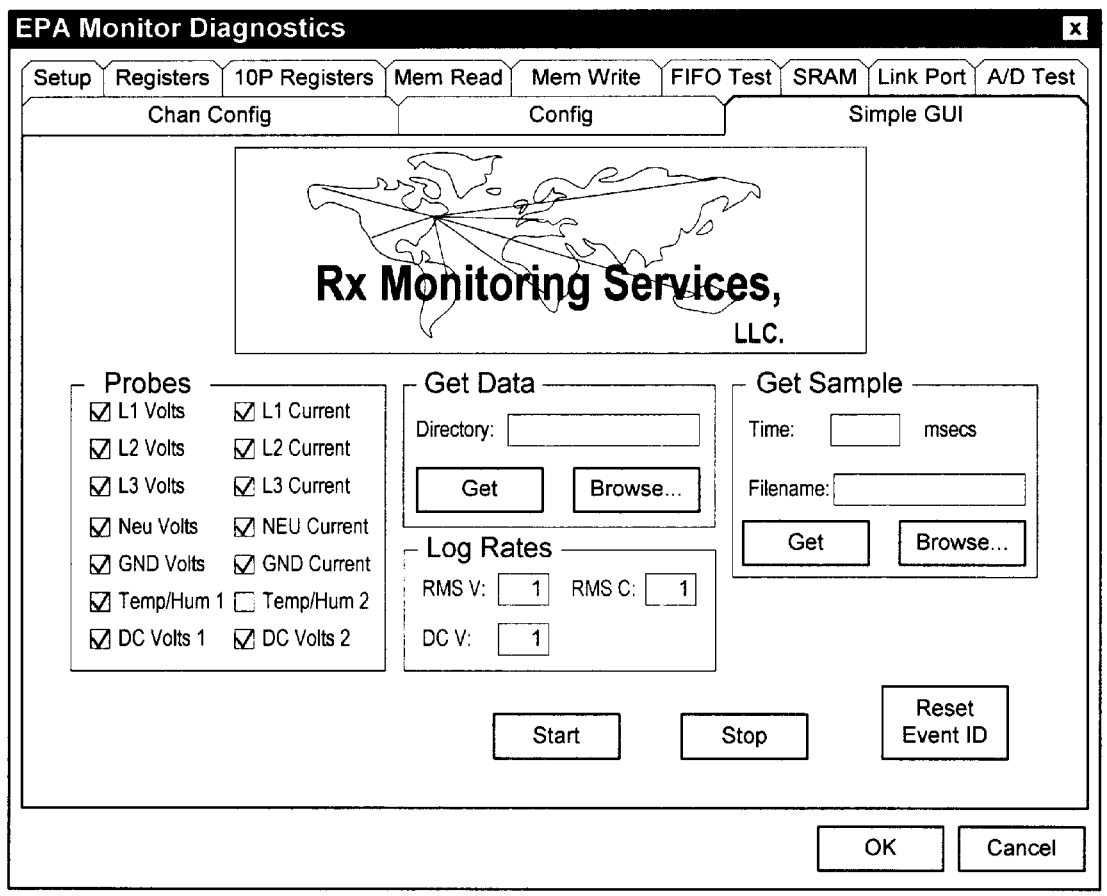
FIGS. 5–16 illustrate graphical user interface screens allowing a user to interface with the system, according to one embodiment of the present invention.
Figure 6:
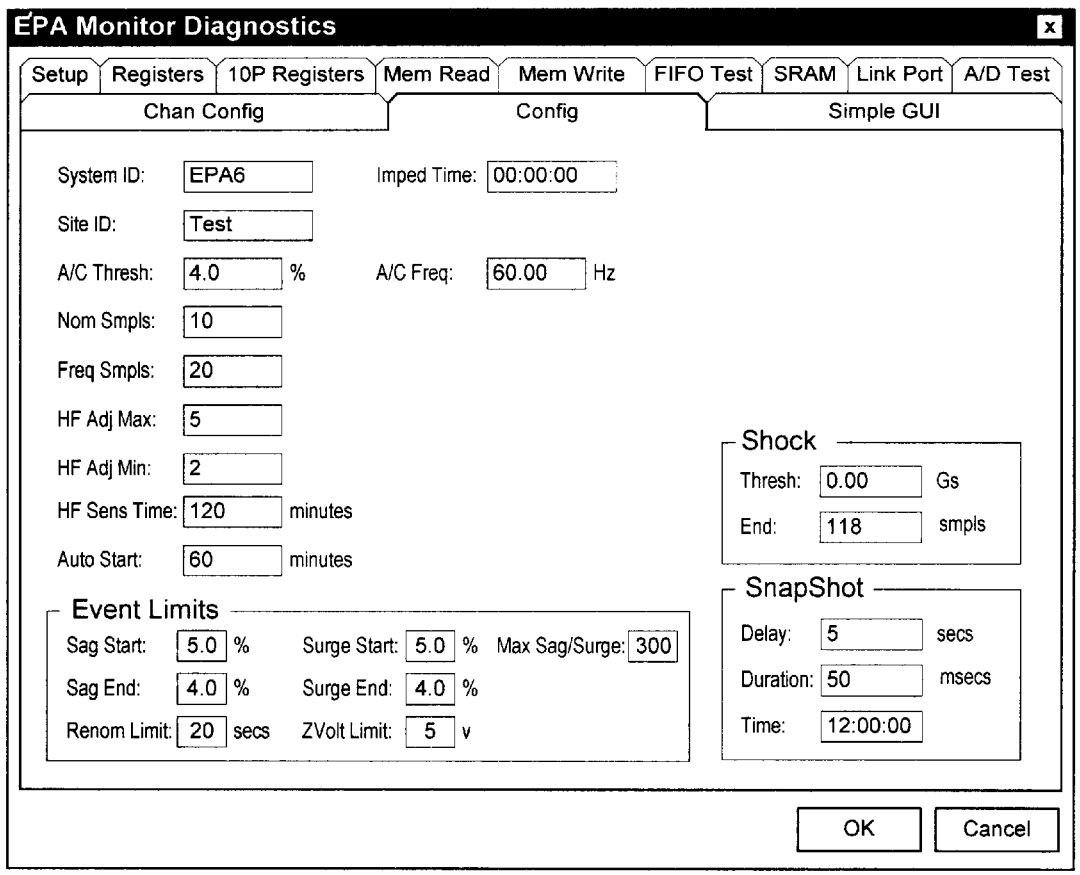
Figure 7:
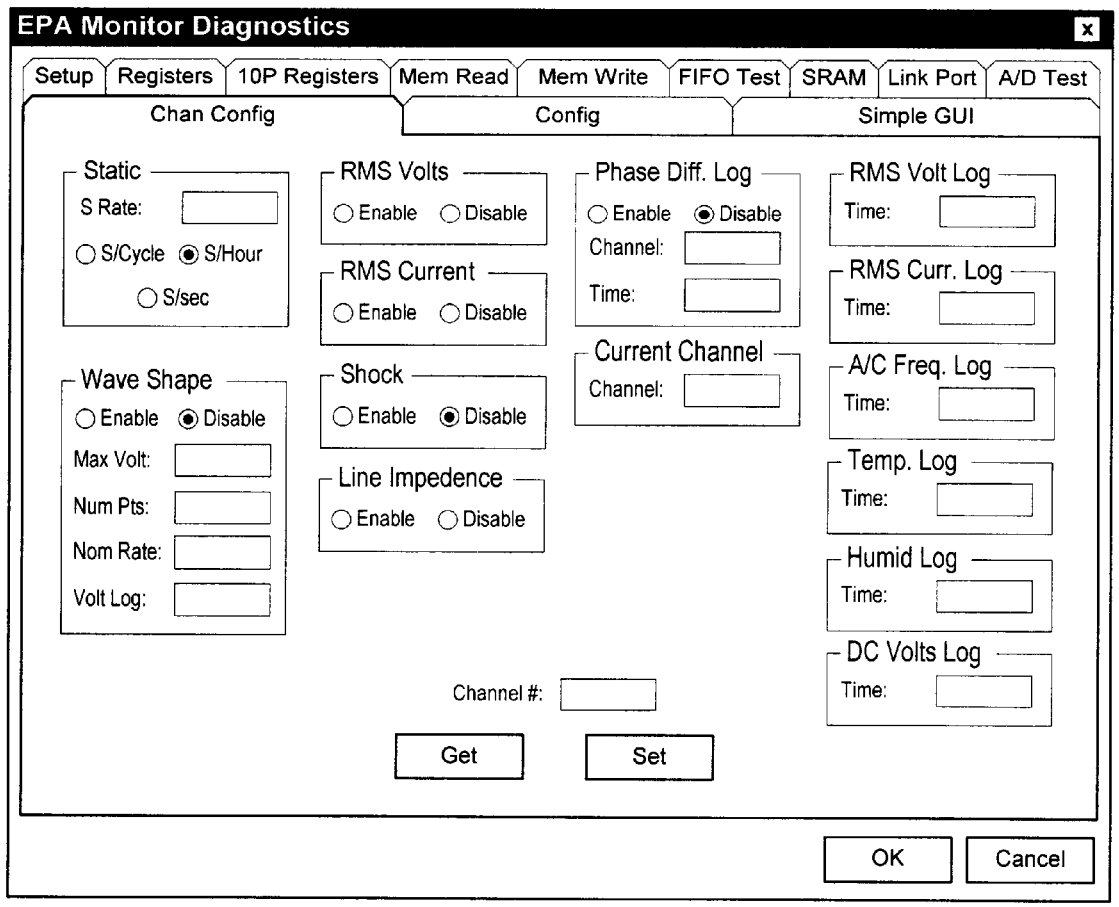
Figure 8:
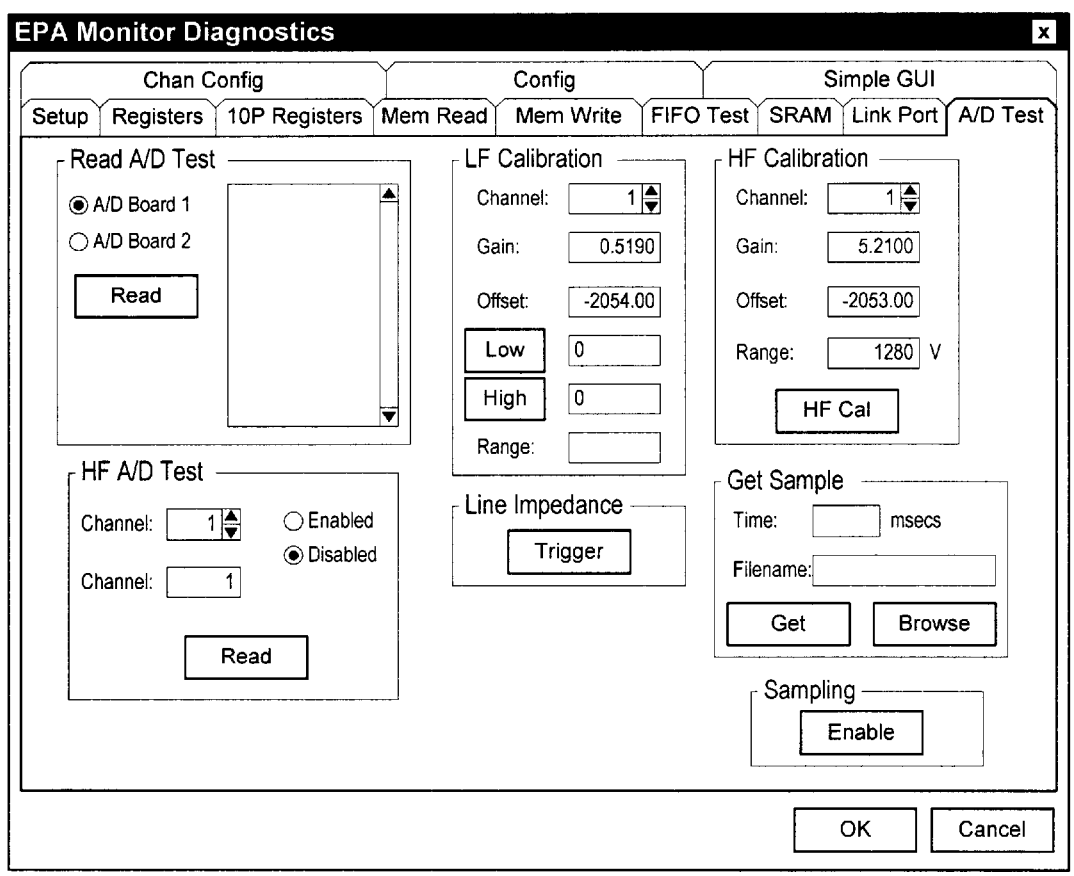
Figure 9:
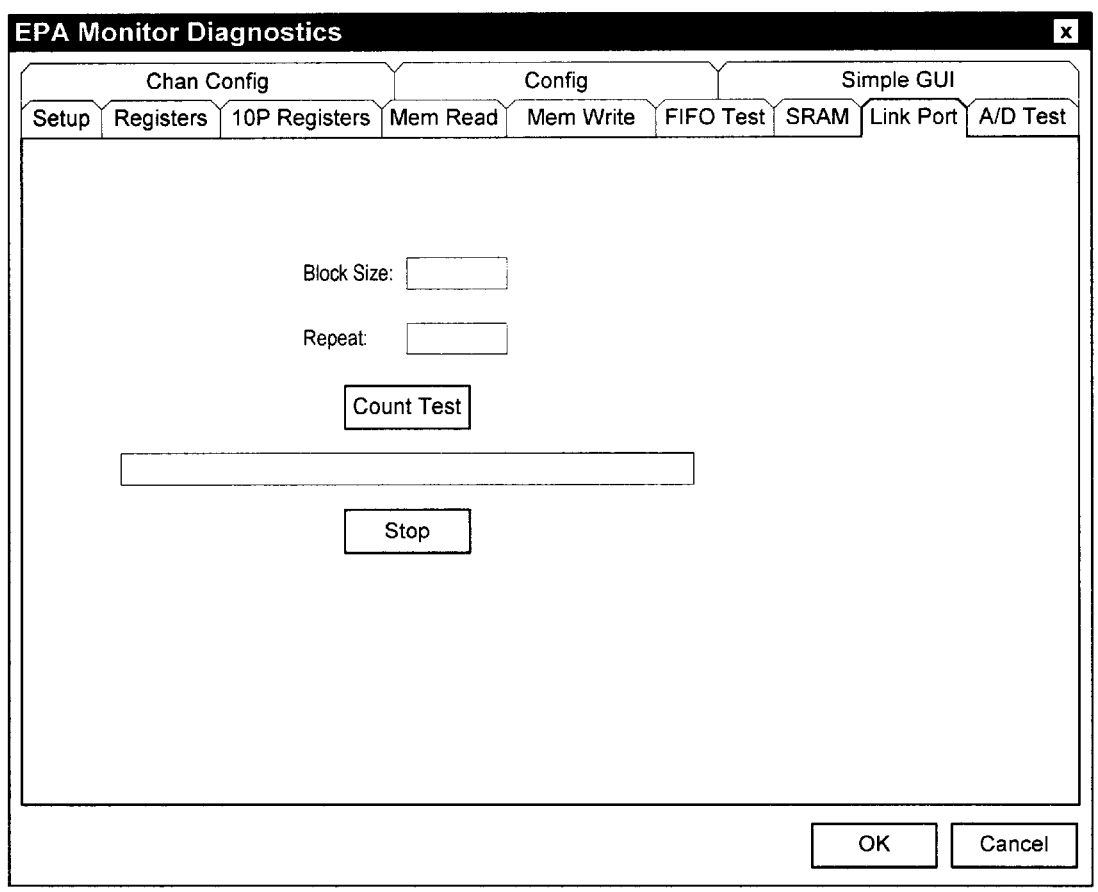
Figure 10:
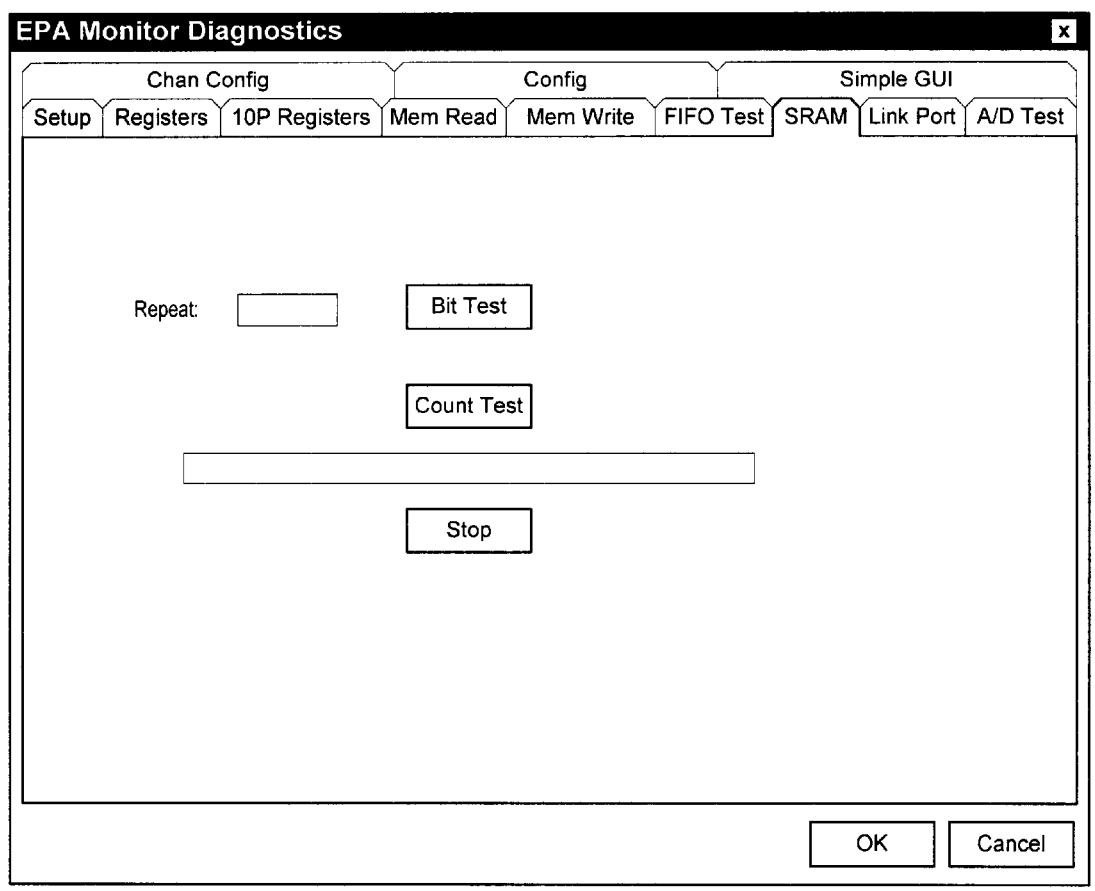
Figure 11:
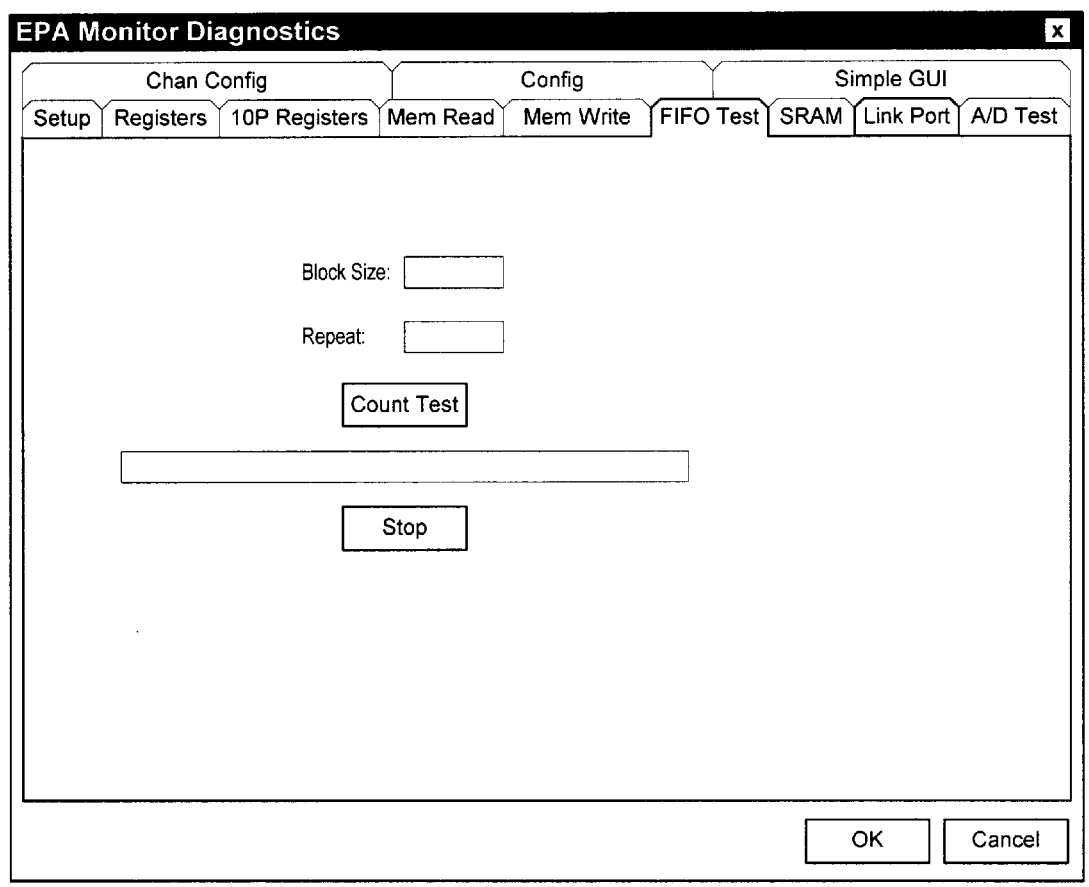
Figure 12:
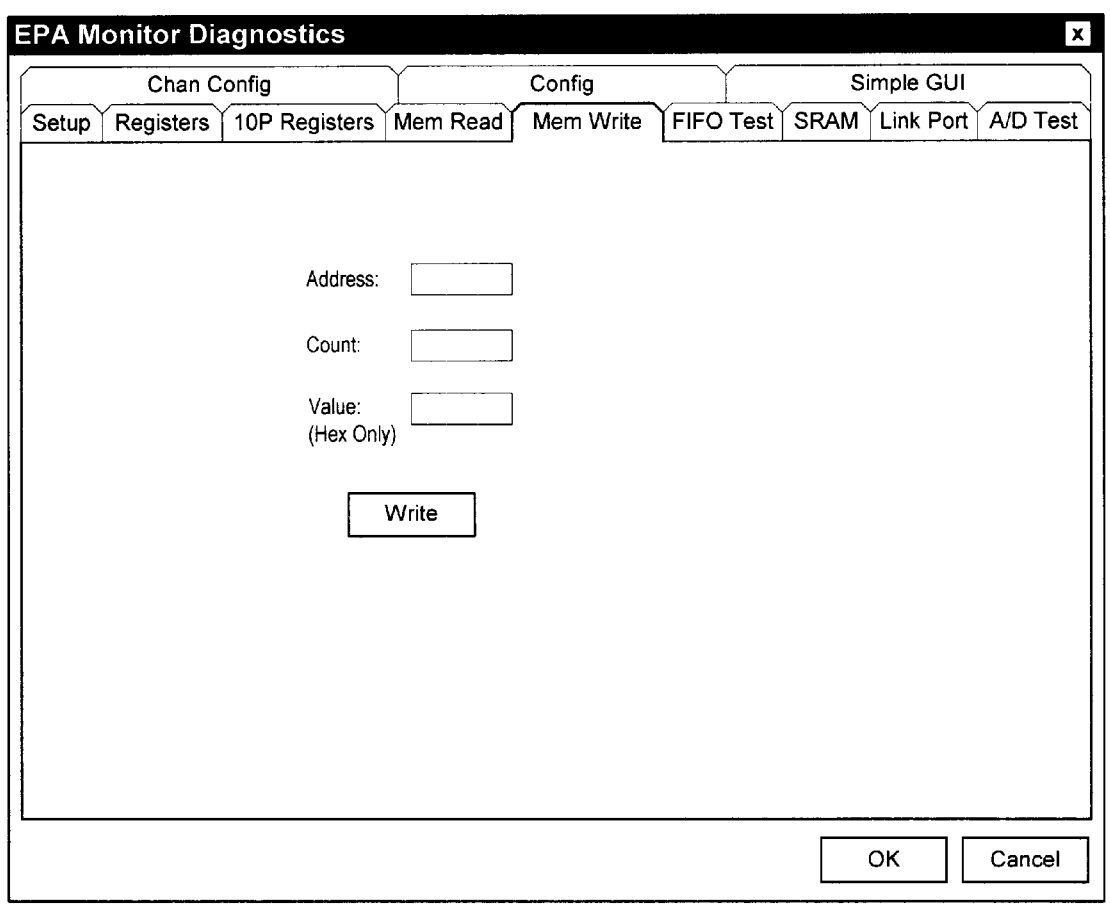
Figure 13:
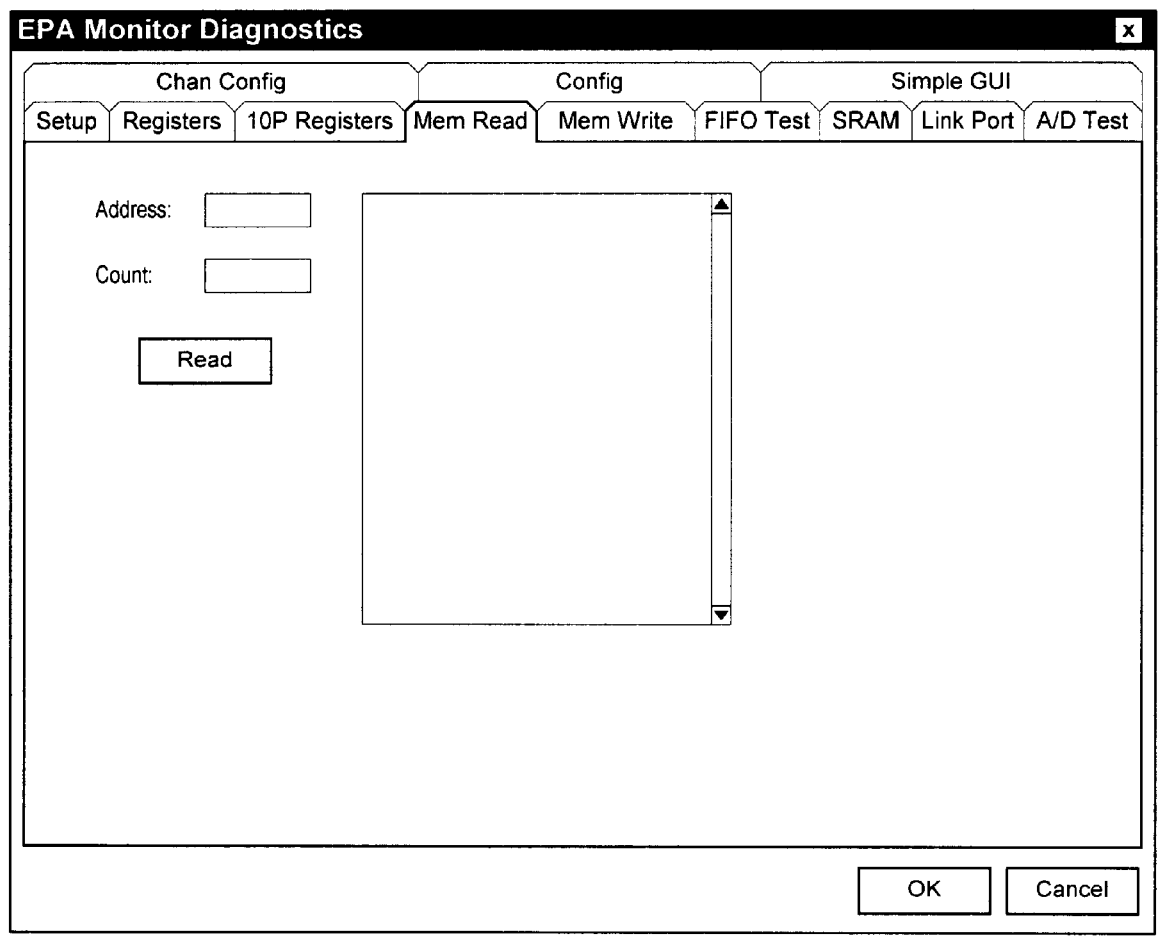
Figure 14:
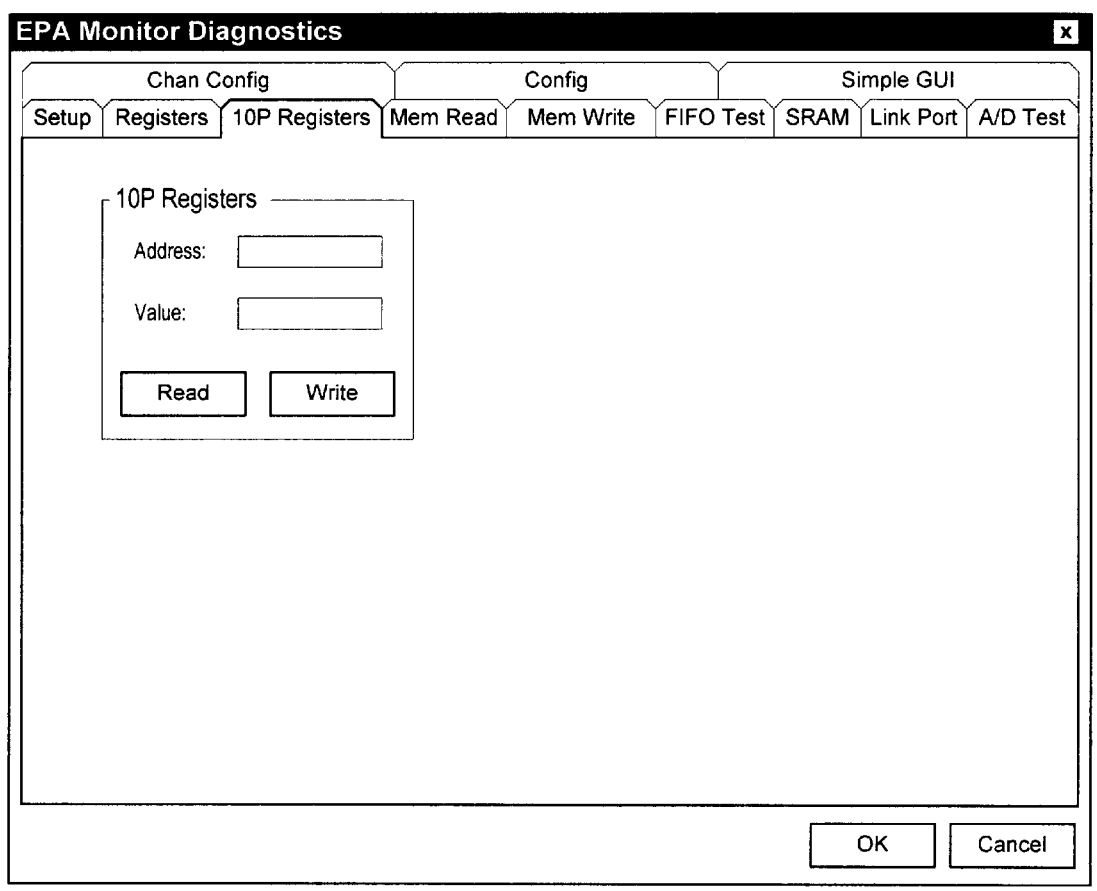
Figure 15:
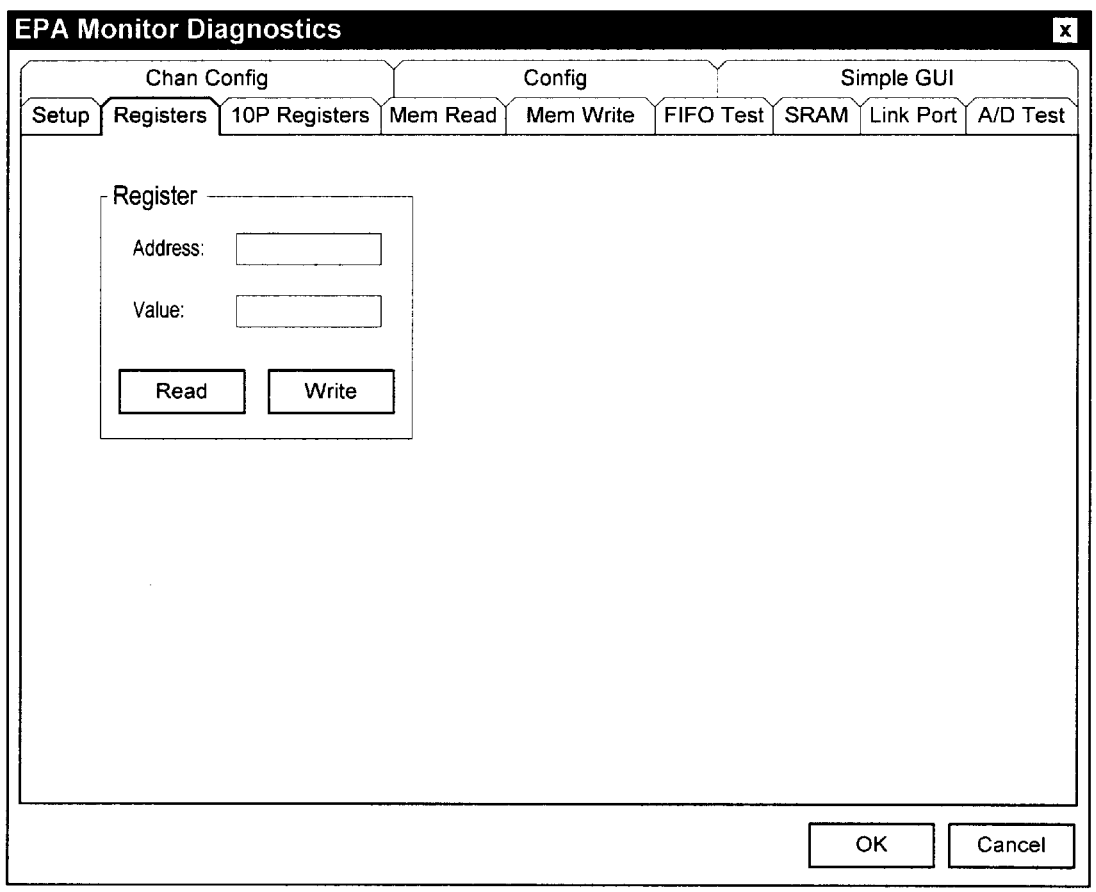
Figure 16:
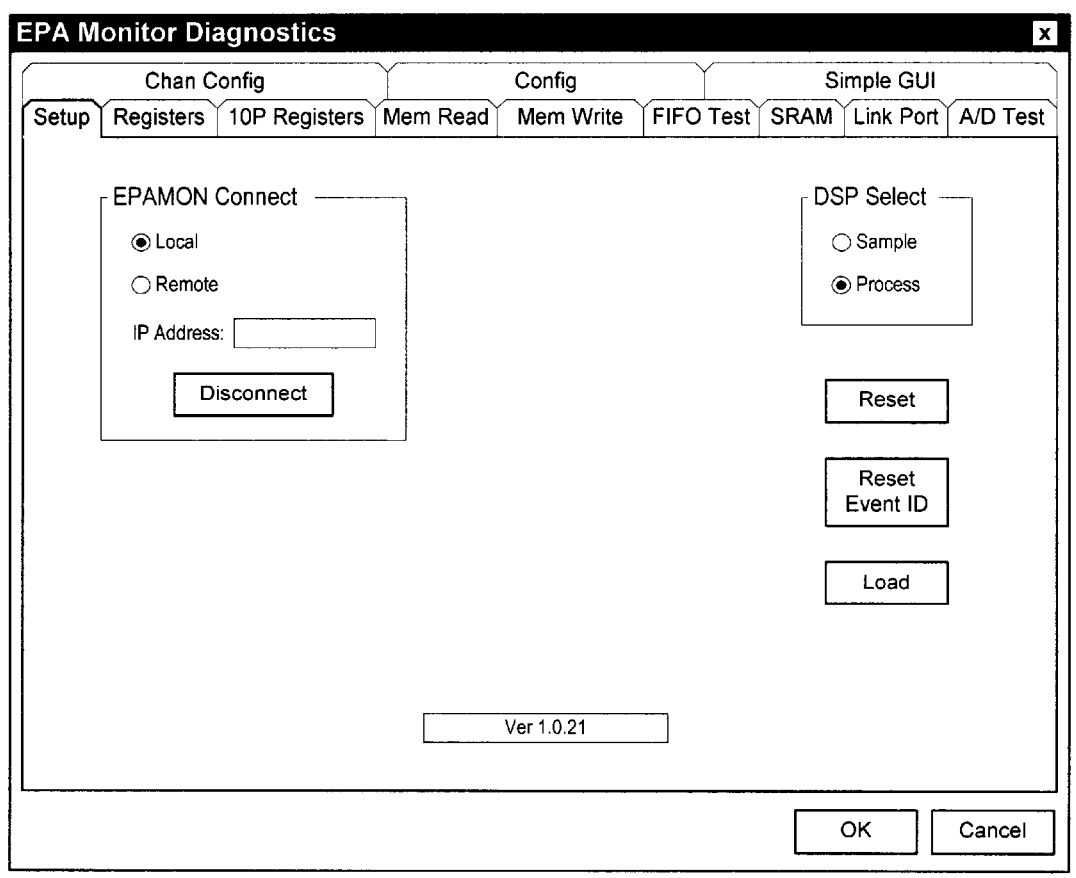

The system 10 preferably includes software for configuring and testing the analog boards 26 and the DSP board 22. The screens shown in FIGS. 5–16 illustrate one embodiment of the graphical user interface (GUI) for the software of the present invention. The GUI screens shown in FIGS. 5–7 are used to configure the system 10. Configuration options include measurement requirements, operational limits, sample rates, log rates, and multi-purpose channels, as will be described in greater detail below. Configuration can be performed remotely or through a local interface. The GUI screens shown in FIGS. 8–16 are used to test and debug the system 10, for example, the analog boards and other hardware components.

A specific example of the data sampling and data processing according to one embodiment of the present invention is described below. According to this example, the inputs to the system 10 include, but are not limited to, voltage, grounds, current, DC voltage, temperature, vibration, and humidity. The system 10 acquires voltage data on the high/low frequency voltage channels including low frequency voltage data and high frequency voltage data. In one example, the low frequency voltage data includes 12 bit values sampled at 512 samples/cycle and having a range of +/− 1024 volts (0.5 V per bit) and the high frequency voltage data includes 12 bit values samples at 2 sample/sec and having a range of +/− 10240 volts (5 V per bit). The high/low frequency voltage channels can be used to monitor any combination of phase, neutral, and ground connections (e.g., L1–L2, L1–L3, L2–L3, L1–N, L1–G, L2–N, L2–G, L3–N, L3–G, N–G).

The system 10 monitors the potential of different grounds by recording changes in voltage across various grounds using either the high/low frequency voltage channels or the multi-purpose channels. The system 10 reads the current for each phase to neutral and ground for range of at least +/−500 amps and samples at a rate of up to 6,000 samples per second using the multi-purpose channels. The system 10 records the DC voltage using either the high/low frequency voltage channels or the multi-purpose channels. The system 10 records the temperature at configurable time intervals (e.g., 1 min.) using any of the multi-purpose channels. The system 10 monitors the vibration level at a sample rate of at least about 6,000 samples per second using any of the multi-purpose channels. The system 10 also records the non-condensing relative humidity, from about 10% to 90%, with an accuracy of about +/−2% at a configurable rate using any of the multi-purpose channels.

After the system 10 is configured and set up (e.g., by connecting the probes to the inputs), the system 10 can be activated (e.g., by pressing a start button). The system 10 preferably starts automatically after a configurable period of time. After the system 10 starts a series of diagnostics are performed on the configured inputs to ensure that the data is valid. The system 10 then begins reading and processing data. The starting or stopping of the system 10 generates an event recorded in the event log 96.

The processing includes, but is not limited to, A/C wave-shape events, high frequency voltage events, low frequency ground monitoring, high frequency ground events, RMS volts, phase differential computations, A/C frequency computations, current computations, and logging off temperature, vibration, and humidity. Since measuring voltage is the main function in this example, a number of different types of processing are performed on the voltage data.

A/C wave-shape monitoring is preferably used with the high/low frequency voltage channels but can also be configured for any of the multi-purpose channels. A/C wave-shape monitoring compares each A/C wave-shape against some nominal wave-shape. When the monitoring system 10 starts, it samples a configurable number of A/C wave-shapes and averages them together to generate the nominal A/C wave-shape. Once the nominal A/C wave-shape is generated, a log entry is appended to the event log file including the following information: date/time stamp; event type - Nominal; channel; nominal voltage data filename; A/C frequency; and A/C frequency differential (if applicable). This nominal wave-shape is then used to compare each successive A/C cycle. If the voltage deviates by a configurable number of volts from the nominal for a configurable number of points, an event entry is appended to the event log file including the following information: date/time stamp; event type—voltage sag or surge; channel; duration; max voltage; classification of deviation; and event data filename (if applicable).

The raw event data for A/C wave-shape events can also be stored, either unconditionally for diagnostic purposes, or through some other criteria. The raw data is stored, beginning with the cycle in which the event occurred; up to some configurable number of raw data points. Raw current data can also be stored for the duration of the A/C wave-shape event. The nominal wave-shaped can be regenerated, for example, if a major change in the wave-shape is detected or unconditionally at some fixed interval.

High frequency voltage event processing is configured for the high/low frequency voltage channels. Certain high frequency voltage data events can be processed using the 10/90/Peak/50 standard by determining when the following data points occur relative to the start of the event: 10% of peak voltage; 90% of peak voltage; peak voltage; 50% of the falling peak voltage; and duration. From these data values, an accurate representation of a high frequency voltage event, such as a unidirectional impulse or a ringing impulse, can be generated. Other data points, in addition to or in place of the 10/90/Peak/50 standard, can also be used to process and store high voltage event data. When processing data for a ringing impulse, for example, in addition to using the 10/90/Peak/50 standard, the peak voltage points and zero-crossing points are determined until the ringing impulse has deteriorated to a predetermined point (e.g., less than 10% of peak). For arcing impulses, the following data points are determined: start of impulse, positive peak voltage, negative peak voltage, and end of impulse. An event entry for the high frequency voltage event is added to the event log file and includes the following information: date/time stamp; event type—high frequency voltage; channel; data points defining event (e.g, 10% point; 90% point; peak point; 50% point; duration) the voltage data filename (if applicable); and current data filename (if applicable).

Processing of the high frequency events also includes marking the location where the high frequency event occurs within the wave-shape. The peak voltage data value read from the high frequency event data replaces the data value within the wave-shape data at the point at which the high frequency event occurred. This preserves the general location of the high frequency event and provides a more accurate representation of the event within the wave-shape data. The system 10 can also record raw voltage data to a file, either unconditionally for diagnostic purposes, or through some other configurable criteria. If raw voltage data is recorded, the system 10 can also be configured to store the corresponding raw current data.

Processing of high frequency events further includes controlling the sensitivity level of the frequency at which high frequency events occur. When the monitor starts, as part of the nominal wave-shape processing discussed above, the sensitivity can be continuously decreased until the high frequency input stabilizes. A sensitivity level log entry is then added to the event log file and includes the following information: date/time stamp; event type—high frequency sensitivity; sensitivity setting. The sensitivity level can be re-adjusted if the high frequency events occur too frequently and can be adjusted according to user defined criteria.

High frequency ground events are configured for one of the high/low frequency voltage channels. High frequency voltage transients for ground are processed similar to the high frequency voltage events with the exception that no marker is placed on the wave-shape data since there is no wave-shape.

Low frequency ground monitoring can be configured for any one of the high/low frequency voltage channels or the multi-purpose channels. Low frequency ground monitoring logs the minimum, maximum, and average voltage read for some configurable period of time. An entry is appended to the ground monitoring data log file used for that channel. The log entry includes: date/time stamp; minimum volts; maximum volts/ and average volts.

RMS processing is preferably performed on the high/low voltage channels but can be configured for any of the multi-purpose channels. RMS calculations are made for each A/C volt cycle for a configurable period of time, the maximum, minimum, average RMS values are gathered and added as an entry to the RMS data log file used for that channel. The RMS log entry includes: date/time stamp; RMS minimum; RMS maximum; and RMS average.

Phase differential is computed between any two channels capturing A/C voltage by comparing the zero cross points on the two channels and counting the number of data points between the two. Phase differential is computed and reported as part of the nominal wave-shape event discussed above. Any change in the phase differential shows up within a voltage event, when the nominal wave-shape is recomputed.

A/C frequency is determined prior to generating the nominal wave-shape, as discussed above. Initially, the system samples at the configured sample rate and assumes an A/C frequency of 60 Hz. Using the first wave-shape channel with valid data, the system then counts the number of points between zero crossings. If the number of points does not match the number of points/cycle sample rate, the frequency is recomputed and the new A/C frequency is used to compute the sample rate for all of the A/C voltage and current channels. The A/C frequency is reported as part of the nominal wave-shape event discussed above. A change in the A/C frequency results in a voltage event, and the A/C frequency is recomputed when a new nominal wave-shape is generated.

For current monitoring, the minimum, maximum, and average RMS current is computed and recorded for some configurable period of time. An entry is appended to a current data log file for that channel and includes the following information: date/time stamp; minimum current; maximum current; and average current. The rate at which the channel is sampled and the time interval at which the min/max/avg is computed are configurable.

For temperature monitoring, the temperature is periodically sampled at a configurable sampling rate. A log entry is appended to the temperature data log file for that channel including the following information: date/time stamp; and temperature—degrees Celsius.

For vibration monitoring, an event is generated if the vibration exceeds a threshold and the impulse frequency of the vibration event is recorded.

For humidity monitoring, the humidity is periodically sampled at a configurable sampling rate. A log entry is appended to the humidity data log file including the following information: date/time stamp; and humidity—percent humidity.

The system 10 can also be used to perform interactive tests by taking measurements on the input and output of a device, such as an UPS, while downloading the internal system log of the UPS. The system 10 can also perform line impedance tests by interfacing to an external test system and adding data to the event log of the system 10. The interactive tests can be controlled automatically by the PC 20 or manually.

Figure 18:
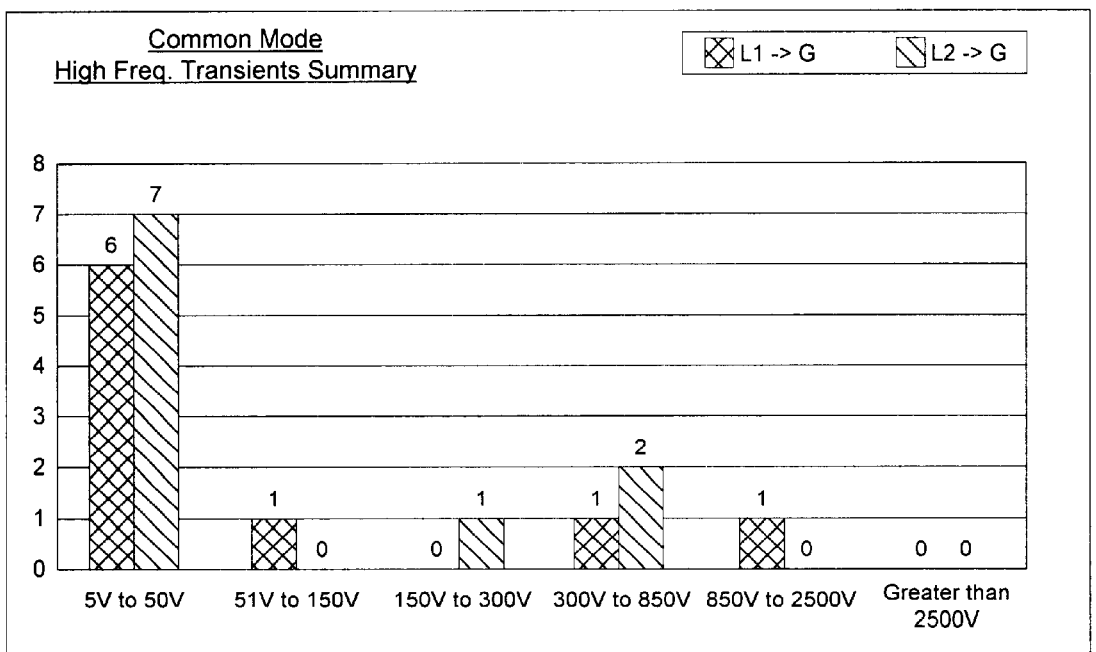
Figure 19:
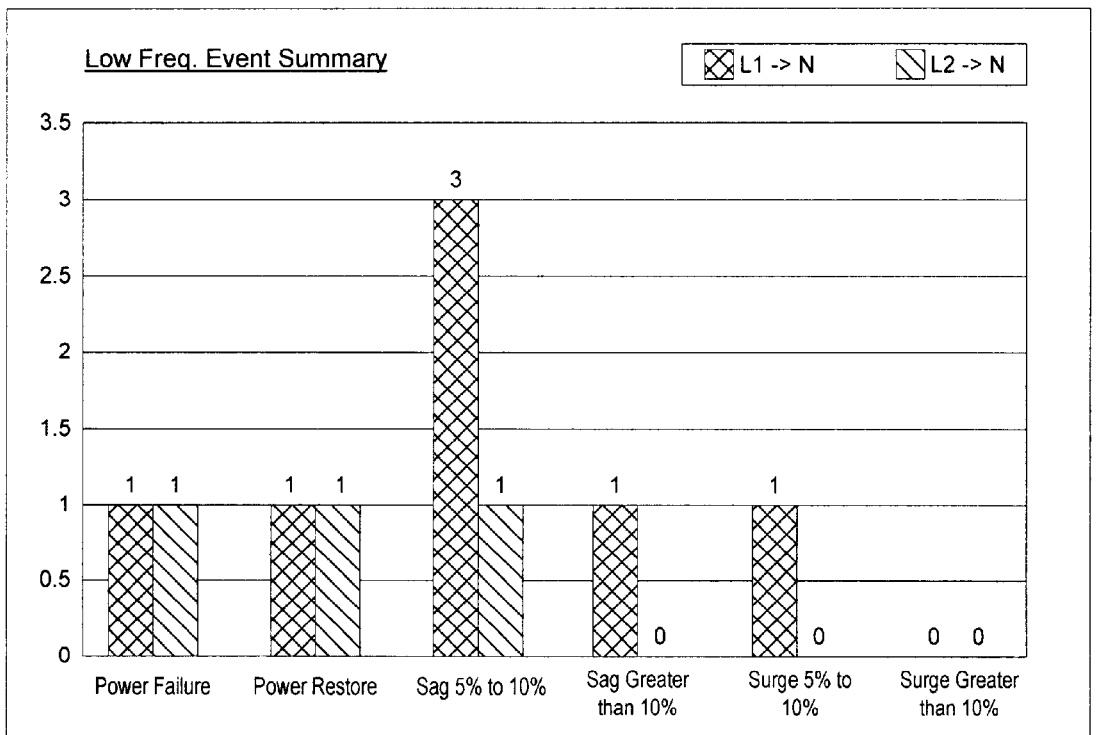

Examples of the reports and graphs generated by the system 10 are shown in FIGS. 17–26. A summary report 100, FIG. 17, allows a customer to easily see the results of the power and environmental condition survey. The summary report includes a summary of the power quality events that occurred and a summary of the data that was logged. A high frequency voltage event summary chart 102, FIG. 18, shows the number of events whose peak voltage occurred within each voltage range. Although the chart 102 shows L1 and L2 common modes, the remaining common modes and normal mode transient summaries can be presented in additional charts. A low frequency voltage event chart 104, FIG. 19, summarizes all of the low frequency event classified into various categories.

Figure 21:
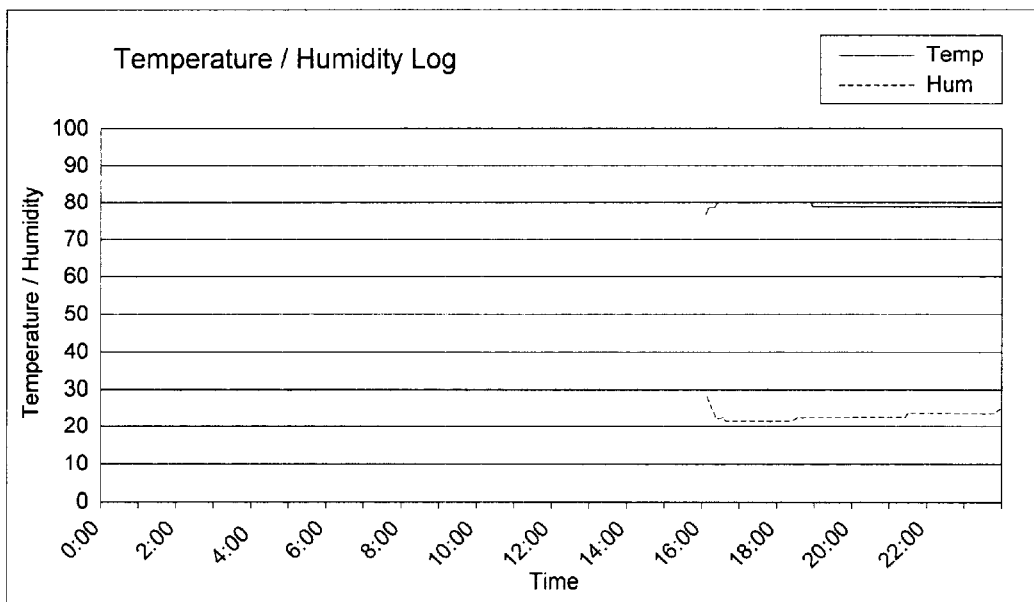
Figure 22:
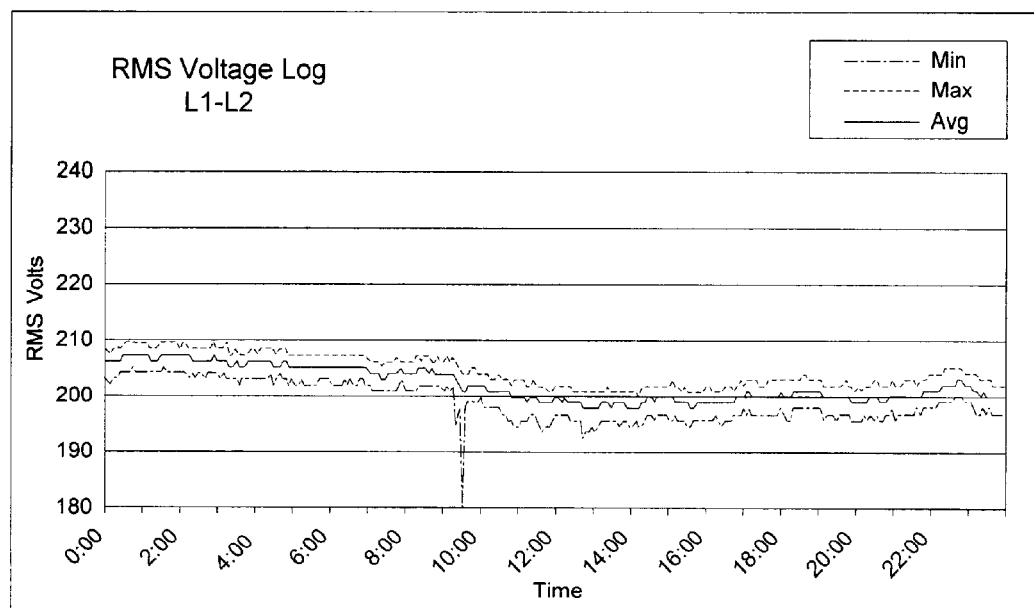

A detailed event log report 106, FIG. 20, is a table containing a log of all the events, when then occurred (e.g., date/time), event type, the channel, and other parameters. A temperature/humidity log graph 108, FIG. 21, plots the temperature (degrees C) and humidity (percent) against time. An RMS voltage log graph 110; FIG. 22, plots a history of the maximum, minimum, and average RMS volt values over a period of time. Although the graph 110 shows the RMS voltage for a single channel L1–L2, additional RMS voltage graphs can be generated for other channels. A similar graph can also be generated for RMS current for each of the current channels.

Figure 23:
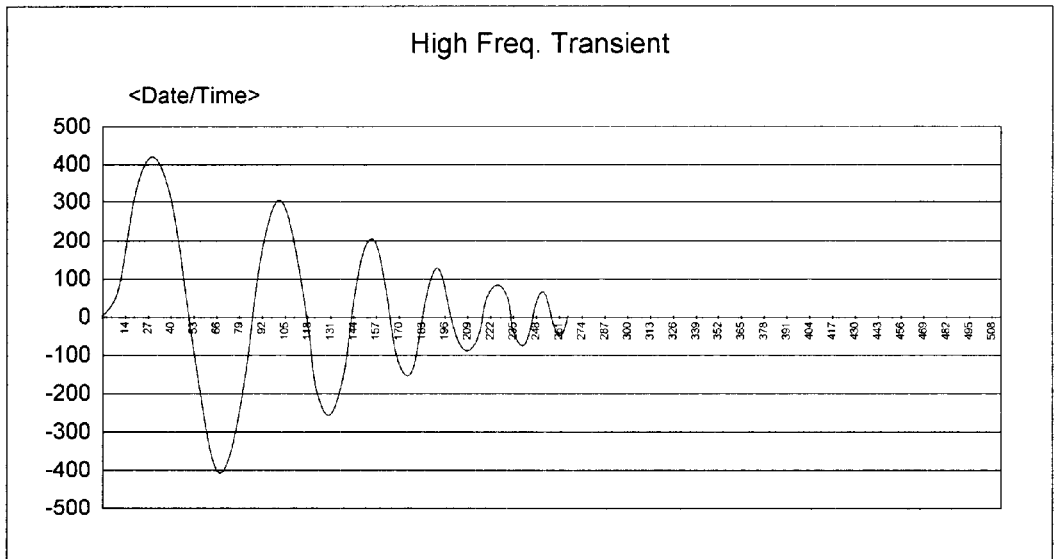
Figure 24:
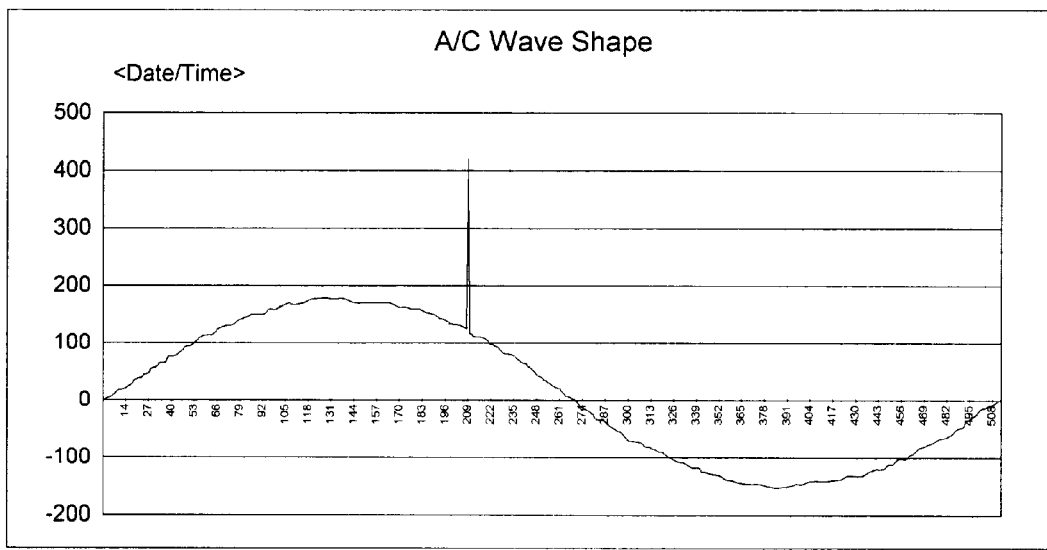
Figure 25:
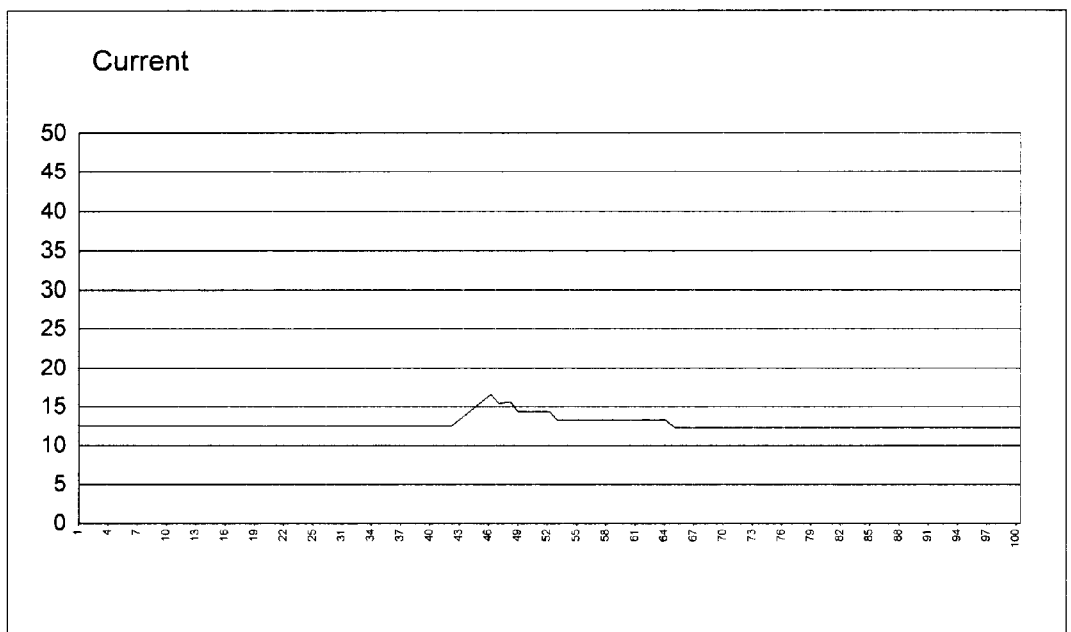
Figure 26:
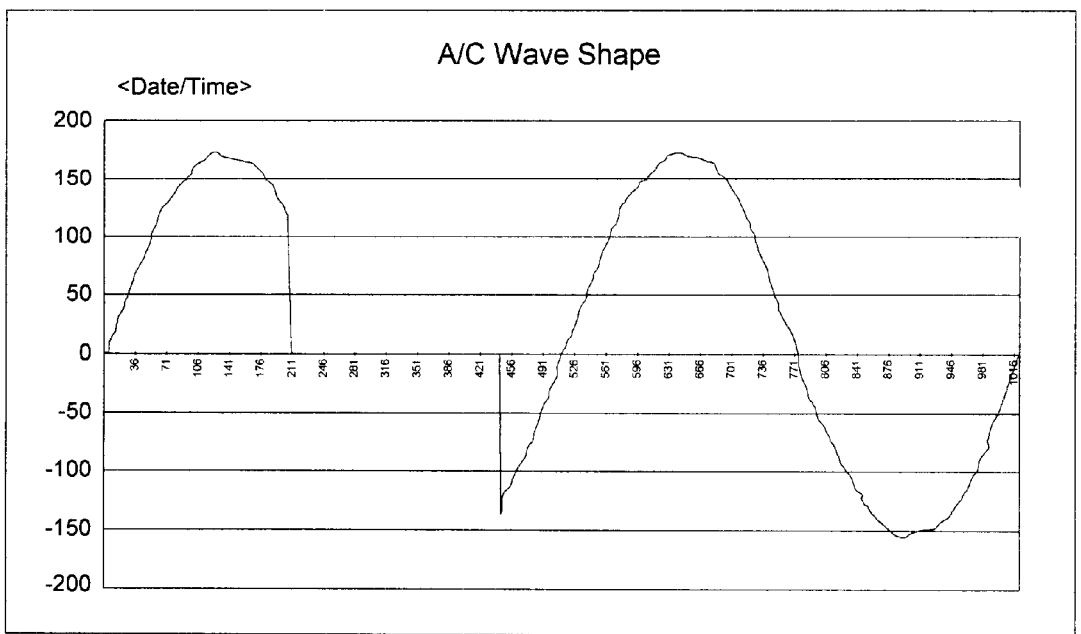

A series of reports can also be generated for a particular high frequency event including a high frequency graph 112, FIG. 23, a low frequency (or A/C wave shape) graph 114, FIG. 24, and a current log graph 116, FIG. 25. A report for low frequency events includes an A/C wave shape graph 118, FIG. 26, and optionally a current log graph associated with the low frequency event. The A/C wave shape graph 118 displays the cycles in which the event occurred. High frequency events (i.e., impulses) and low frequency events (i.e., sags/surges) can also be plotted versus duration.

Accordingly, the present invention provides a system with multiple channels for monitoring power as well as environmental conditions in real time. Implementing the system on a PC facilities set up and operation of the system. The system also improves the processing, storage and transfer of data using the event processing techniques that classify and analyze events with as few data points as necessary. The processing of the data according to the present invention also allows the analyzed data to be presented in a useful format.

Modifications and substitutions by one of ordinary skill in the art are considered to be within the scope of the present invention which is not to be limited except by the claims which follow.

What is claimed is:

1. A power and environmental condition monitoring system, for monitoring power and environmental conditions at a site, said system comprising:

at least one analog signal receiver including a plurality of analog signal channels for receiving a plurality of analog measurement signals representing power and environmental conditions, for converting said analog measurement signals into digital signals including digital signal data, and for buffering said digital signal data, wherein said analog signal channels include at least one high/low frequency voltage channel for monitoring voltage signals including high frequency voltage events and at least one configurable multi-purpose channel for monitoring low frequency analog measurement signals;

at least one digital signal processor, connected to said analog receiver, for reading said digital signal data buffered by said analog signal receiver and for processing said digital signal data, wherein digital signal processor processes said digital signal data by logging at least some of said digital signal data, and wherein digital signal processor processes said digital signal data by analyzing at least some of said digital signal data to detect a pattern consistent with an event and by logging selected values of said digital signal data sufficient to define said event; and a post-processing system, connected to said digital signal processor, for storing and post processing processed digital signal data received from the digital signal processor.

2. The power and environmental condition monitoring system of claim 1, wherein said at least one multi-purpose channel is configurable to monitor one of a low frequency voltage signal, a current signal, and an environmental condition signal.

3. The power and environmental condition monitoring system of claim 1 wherein said post-processing system includes a communications device for communicating with a remote location and for transmitting said processed digital signal data to said remote location.

4. The power and environmental condition monitoring system of claim 1 wherein said post-processing system is implemented on a personal computer.

5. The power and environmental condition monitoring system of claim 4, wherein said at least one analog receiver includes at least one analog board connected to said personal computer, and wherein said at least one digital signal processor includes at least one digital signal processor board connected to said personal computer.

6. The power and environmental condition monitoring system of claim 4 wherein said personal computer includes software for configuring said at least one configurable multi-purpose channel.

7. The power and environmental condition monitoring system of claim 1 wherein said at least one digital signal processor includes:

a sample digital signal processor, connected to said at least one analog signal receiver, for reading said digital signal data buffered by said analog signal receiver, and for addressing and buffering said digital signal data; and a process digital signal processor, connected to said sample digital signal processor, for receiving said digital signal data transmitted by said sample digital signal processor and for processing said digital signal data.

8. The power and environmental condition monitoring system of claim 7 wherein said sample digital signal processor reads said digital signal data representing low frequency analog measurement signals using an interrupt, and wherein said sample digital signal processor polls said analog signal receiver to read said digital signal data representing said high frequency voltage events.

9. The power and environmental condition monitoring system of claim 1 wherein said digital signal processor communicates with an internal uninterruptible power supply (UPS) for detecting power outages.

10. The power and environmental condition monitoring system of claim 1 wherein said post-processing system includes software for generating a data report, wherein said data report includes at least a summary of at least some of said processed digital signal data.

11. The power and environmental condition monitoring system of claim 1 wherein said analog signal receiver includes an isolated measurement circuit for measuring voltage signals.

12. The power and environmental condition monitoring system of claim 1 wherein said analog signal receiver includes at least one peak detect circuit for detecting said high frequency voltage signals representing said high frequency voltage events.

13. The power and environmental condition monitoring system of claim 12 wherein the sensitivity of said peak detect circuit is configurable to filter out unwanted high frequency signals.

14. An analog signal receiver for use in a power and environmental condition monitoring system that monitors power and environmental conditions at a site, said analog signal receiver comprising:

a plurality of analog signal inputs including high/low voltage signal inputs for receiving voltage signals and multi-purpose inputs for receiving low frequency analog measurement signals;

a plurality of isolated measurement circuits for measuring said voltage signals received on said high/low voltage signal inputs, wherein each of said isolated measurement circuits includes an isolating amplifier and an isolated signal transmitter connected to said isolation amplifier;

analog signal processing circuitry for processing said voltage signals and said low frequency analog measurements signals;

a multiplexer for multiplexing said voltage signals and said analog measurement signals into a multiplexed low frequency analog signal;

a low frequency A/D converter for converting said multiplexed low frequency analog signal to low frequency digital signal data;

a low frequency buffer for buffering said low frequency digital signal data;

a high frequency voltage event detector for detecting high frequency voltage events;

at least one high frequency A/D converter for converting said high frequency voltage events to high frequency voltage digital data; and a high frequency buffer for buffering said high frequency voltage digital data.

15. The analog signal receiver of claim 14 wherein said isolated signal transmitter includes one of a linear optocoupler, a transformer coupler, and a capacitive coupler.

16. The analog signal receiver of claim 14 wherein said high/low frequency voltage inputs include voltage inputs for each phase.

17. The analog signal receiver of claim 14 wherein said multi-purpose inputs are selects from the group consisting of current inputs, low frequency voltage inputs, and environmental condition sensor inputs.

18. The analog signal receiver of claim 14 wherein said high frequency voltage event detector includes a peak detect circuit for detecting said high frequency voltage events.

19. A method for processing data in a power and environmental condition monitoring system, said method comprising:

receiving high frequency data and low frequency data, representing voltage signals and environmental condition signals;

generating data log entries, wherein each of said data log entries includes at least a date/time stamp and at least some of said low frequency data;

logging said data log entry in a data log;

classifying said high frequency data and said low frequency data to determine an event classification;

analyzing said high frequency data and said low frequency data based upon said event classification and selecting sufficient event data values to define said event;

generating an event data log entry; and logging said event data log entry into an event log.

20. The method of claim 19 further including the step of generating a data report including at least a summary of processed data from said data log and said event log.

21. The method of claim 19 wherein receiving said high frequency data and said low frequency data includes polling high frequency buffers on an analog signal receiver to read high frequency event data.

22. The method of claim 19 wherein receiving said high frequency data and said low frequency data includes reading low frequency data from low frequency buffers using a programmable interrupt.

23. The method of claim 18 further including the step of buffering said low frequency data and said high frequency data after receiving said high frequency data and said low frequency data.

24. A method of monitoring power and environmental conditions, said method comprising:

receiving analog voltage signals over high/low frequency voltage inputs and receiving analog measurement signals over multi-purpose inputs;

converting said analog voltage signals and said analog measurement signals into low frequency digital data;

monitoring said analog voltage signals to detect high frequency voltage signals representing high frequency voltage events;

converting said high frequency voltage signals into high frequency digital data;

processing said low frequency digital data by logging selected values of said low frequency digital data into at least one data log file; and processing said low frequency digital data and said high frequency digital data by detecting events and logging said events in an event log file.

25. The method of claim 24 wherein receiving said analog voltage signals includes taking high frequency voltage measurements and low frequency voltage measurements over an isolated measurement circuit.

26. The method of claim 24 further including the step of buffering said high frequency digital data and said low frequency digital data prior to processing.

27. The method of claim 24 further including the step of configuring at least one of said multi-purpose inputs to receive different types of analog measurement signals.

28. The method of claim 27 wherein said analog measurement signals are selected from the group consisting of current signals, low frequency voltage signals, and environmental condition signals.

29. The method of claim 24 further including the step of receiving interactive test signals from an input and an output of a device.

30. The method of claim 24 further including the step of performing line impedance tests.

* * * * *